(12) United States Patent
Okada et al.

(10) Patent No.: US 8,121,443 B2
(45) Date of Patent: Feb. 21, 2012

(54) OPTICAL TRANSMISSION APPARATUS

(75) Inventors: Junji Okada, Kanagawa (JP); Ryoji Ishii, Kanagawa (JP); Tomoaki Kojima, Kanagawa (JP); Kazuhiro Sakai, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 419 days.

(21) Appl. No.: 12/390,584

(22) Filed: Feb. 23, 2009

(65) Prior Publication Data

US 2010/0104239 A1   Apr. 29, 2010

(30) Foreign Application Priority Data

Oct. 29, 2008   (JP) .................................. 2008-277580

(51) Int. Cl.
  *G02B 6/12*   (2006.01)
  *G02B 6/26*   (2006.01)
(52) U.S. Cl. ............................................ 385/14; 385/31
(58) Field of Classification Search .................. None
  See application file for complete search history.

(56) References Cited

U.S. PATENT DOCUMENTS

| | | | | |
|---|---|---|---|---|
| 5,125,054 A * | 6/1992 | Ackley et al. | ..................... | 385/49 |
| 6,404,960 B1 * | 6/2002 | Hibbs-Brenner et al. | ...... | 385/52 |
| 6,490,392 B1 * | 12/2002 | Munekata et al. | ............... | 385/31 |
| 6,757,460 B2 * | 6/2004 | Melchior et al. | ................. | 385/31 |
| 6,793,410 B2 * | 9/2004 | Nakanishi et al. | .............. | 385/92 |
| 6,821,027 B2 * | 11/2004 | Lee et al. | ......................... | 385/89 |
| 7,162,127 B2 * | 1/2007 | Ohtsu et al. | ....................... | 385/49 |
| 7,184,669 B2 * | 2/2007 | Gordon | ......................... | 398/138 |
| 7,220,065 B2 * | 5/2007 | Han et al. | ......................... | 385/89 |
| 7,350,982 B2 * | 4/2008 | Ohtsu et al. | ..................... | 385/59 |
| 7,352,922 B2 * | 4/2008 | Iwasaki et al. | .................. | 385/14 |
| 7,376,297 B2 * | 5/2008 | Ide et al. | ......................... | 385/24 |
| 7,764,860 B2 * | 7/2010 | Kodama et al. | ............... | 385/146 |
| 2003/0044119 A1 * | 3/2003 | Sasaki et al. | ..................... | 385/49 |
| 2003/0095756 A1 * | 5/2003 | Tohgoh et al. | .................. | 385/88 |
| 2004/0005119 A1 * | 1/2004 | Han et al. | ......................... | 385/49 |
| 2005/0286831 A1 | 12/2005 | Ohtsu et al. | | |
| 2009/0202199 A1 * | 8/2009 | Sameshima et al. | ............ | 385/15 |

FOREIGN PATENT DOCUMENTS

| | | |
|---|---|---|
| JP | 2000-292656 | 10/2000 |
| JP | 2005-70082 | 3/2005 |
| JP | 2005-284248 | 10/2005 |
| JP | 2006-11210 | 1/2006 |
| JP | 2007-298580 | 11/2007 |
| JP | 2008-20720 | 1/2008 |

* cited by examiner

*Primary Examiner* — Michelle R Connelly Cushwa
(74) *Attorney, Agent, or Firm* — Fildes & Outland, P.C.

(57) ABSTRACT

An optical transmission apparatus includes an optical element that has at least one of a light emitting part and a light receiving part on a surface opposed to a mounting surface of the optical element, an optical waveguide that is made of a polymer material, and has an optical path deflecting part in a through hole or an opening, wherein the optical path deflecting part deflects an optical path of the optical with respect to the at least one of the light emitting part and the light receiving part of the optical element, and a substrate that has a mounting region on which the mounting surface of the optical element is mounted, and a plurality of waveguide holding parts, each holding the optical waveguide so that the optical path deflecting part of the optical waveguide is arranged opposite to the at least one of the light emitting part and the light receiving part of the optical element.

8 Claims, 27 Drawing Sheets

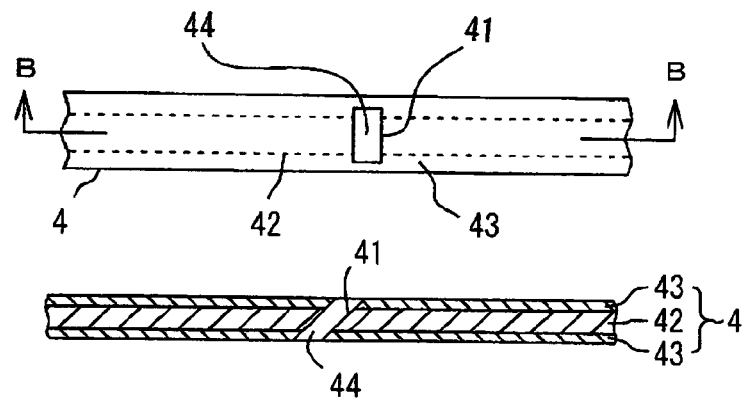
FIG. 4A
FIG. 4B
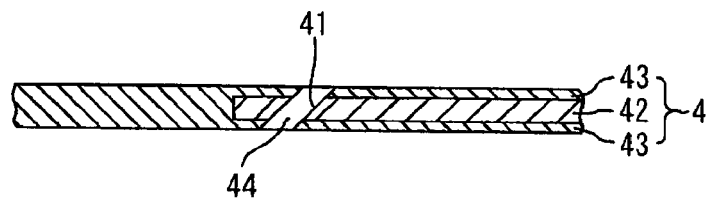
FIG. 5A
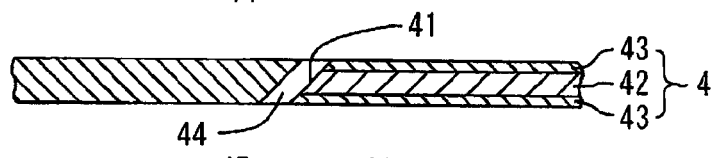
FIG. 5B
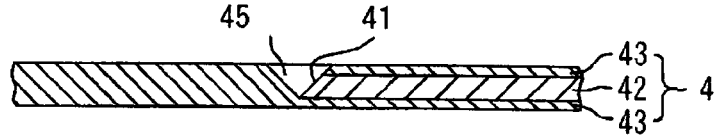
FIG. 5C
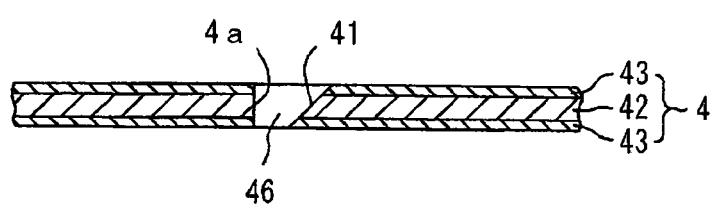
FIG. 5D

OPTICAL TRANSMISSION APPARATUS

CROSS-REFERENCE TO RELATED APPLICATION

This application is based on and claims priority under 35 USC 119 form Japanese Patent Application No. 2008-277580 filed Feb. 26, 2009.

BACKGROUND

1. Technical Field

The present invention relates to an optical transmission apparatus.

2. Related Art

For data transmission between boards in an electronic appliance, there has been adopted electrical interconnection in which an electrically conductive body is used in a transmission line. However, recently, attention has been paid to optical interconnection in which an optical waveguide having flexibility is used as a transmission medium, because it is difficult with the electrical interconnection to conduct the data transmission at high speed and with large capacity, and to prevent noises.

This optical waveguide having flexibility includes an optical path deflecting part such as a 45° mirror.

SUMMARY

According to an aspect of invention, an optical transmission apparatus includes an optical element that has at least one of a light emitting part and a light receiving part on a surface opposed to a mounting surface of the optical element, an optical waveguide that is made of a polymer material, and has an optical path deflecting part in a through hole or an opening, wherein the optical path deflecting part deflects an optical path of the optical with respect to the at least one of the light emitting part and the light receiving part of the optical element, and a substrate that has a mounting region on which the mounting surface of the optical element is mounted, and a plurality of waveguide holding parts, each holding the optical waveguide so that the optical path deflecting part of the optical waveguide is arranged opposite to the at least one of the light emitting part and the light receiving part of the optical element.

BRIEF DESCRIPTION OF THE DRAWINGS

Exemplary embodiments of the invention will be described in detail based on the following figures, wherein:

FIG. 4A is a plan view showing a structure of an optical waveguide;

FIG. 4B is a sectional view taken along a line B-B in FIG. 4B, showing a structure of an optical waveguide;

FIG. 5A is sectional views showing a modification of the optical waveguide;

FIG. 5B is sectional views showing a modification of the optical waveguide;

FIG. 5C is sectional views showing a modification of the optical waveguide;

FIG. 5D is sectional views showing a modification of the optical waveguide;

DETAILED DESCRIPTION

A optical transmission apparatus in exemplary embodiments according to the invention includes an optical element having a light emitting part and a light receiving part which form an optical path in a direction perpendicular to a mounting face, a substrate having a mounting region in which the optical element is mounted and a plurality of waveguide holding parts, and an optical waveguide having an optical path deflecting part which is provided in a through hole or an opening, wherein the optical waveguide is held by a plurality of the waveguide holding parts in a state where the optical path deflecting part is opposed to the light emitting part or the light receiving part interposing a space.

In the above described structure, a distal end portion of the optical waveguide and a portion near the optical path deflection part are held by a plurality of the waveguide holding parts, whereby deflection and slack of the relevant portions may be restrained, even in a state where the optical path deflecting part floats in the air.

First Exemplary Embodiment

Figure 1:
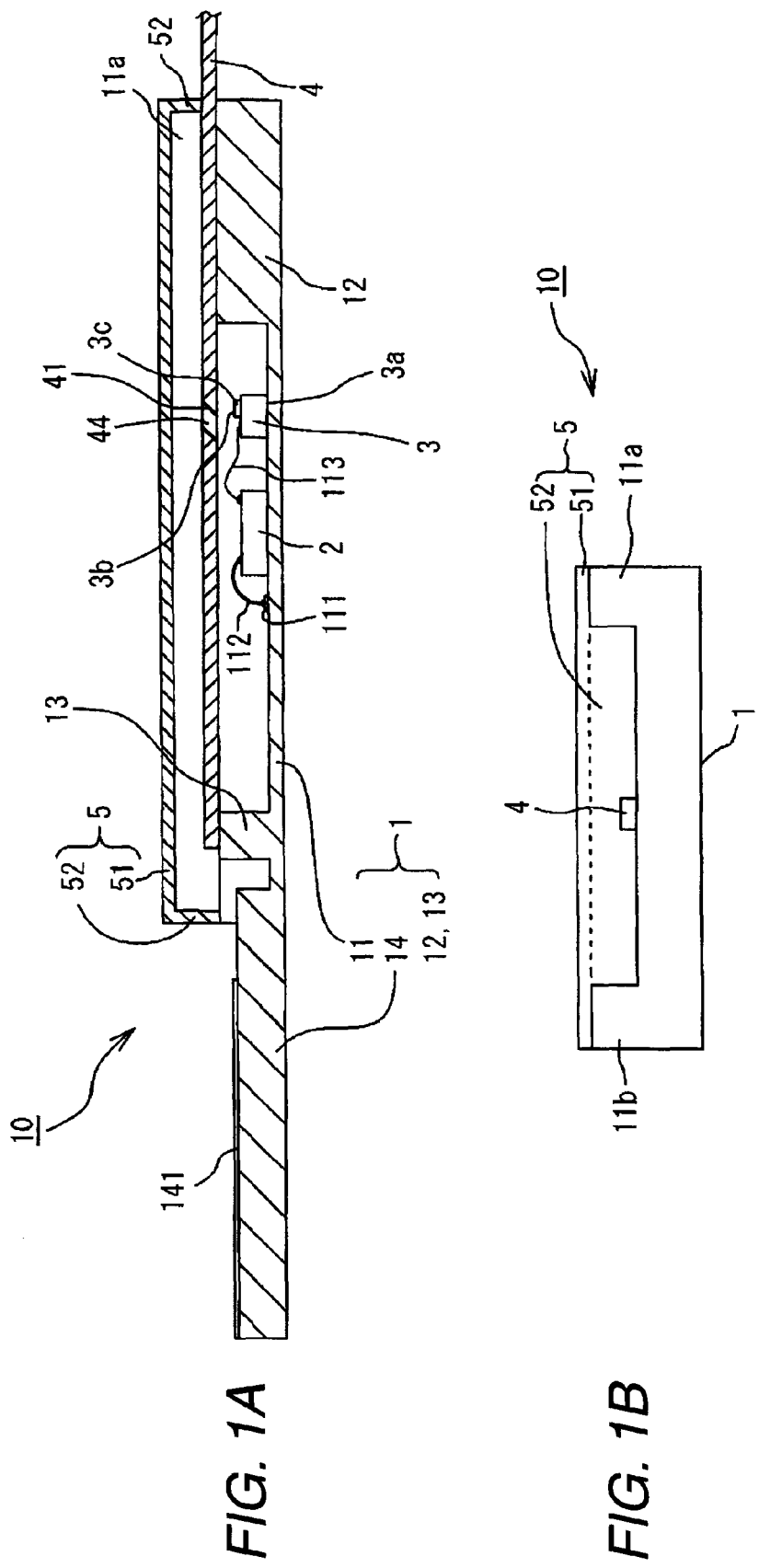
FIG. 1A is a sectional front view showing an optical transmission apparatus in a first exemplary embodiment according to the invention (a sectional view taken along a line A-A in FIG. 2)
FIG. 1B is a right side view showing the optical transmission apparatus in a first exemplary embodiment according to the invention.
Figure 2:
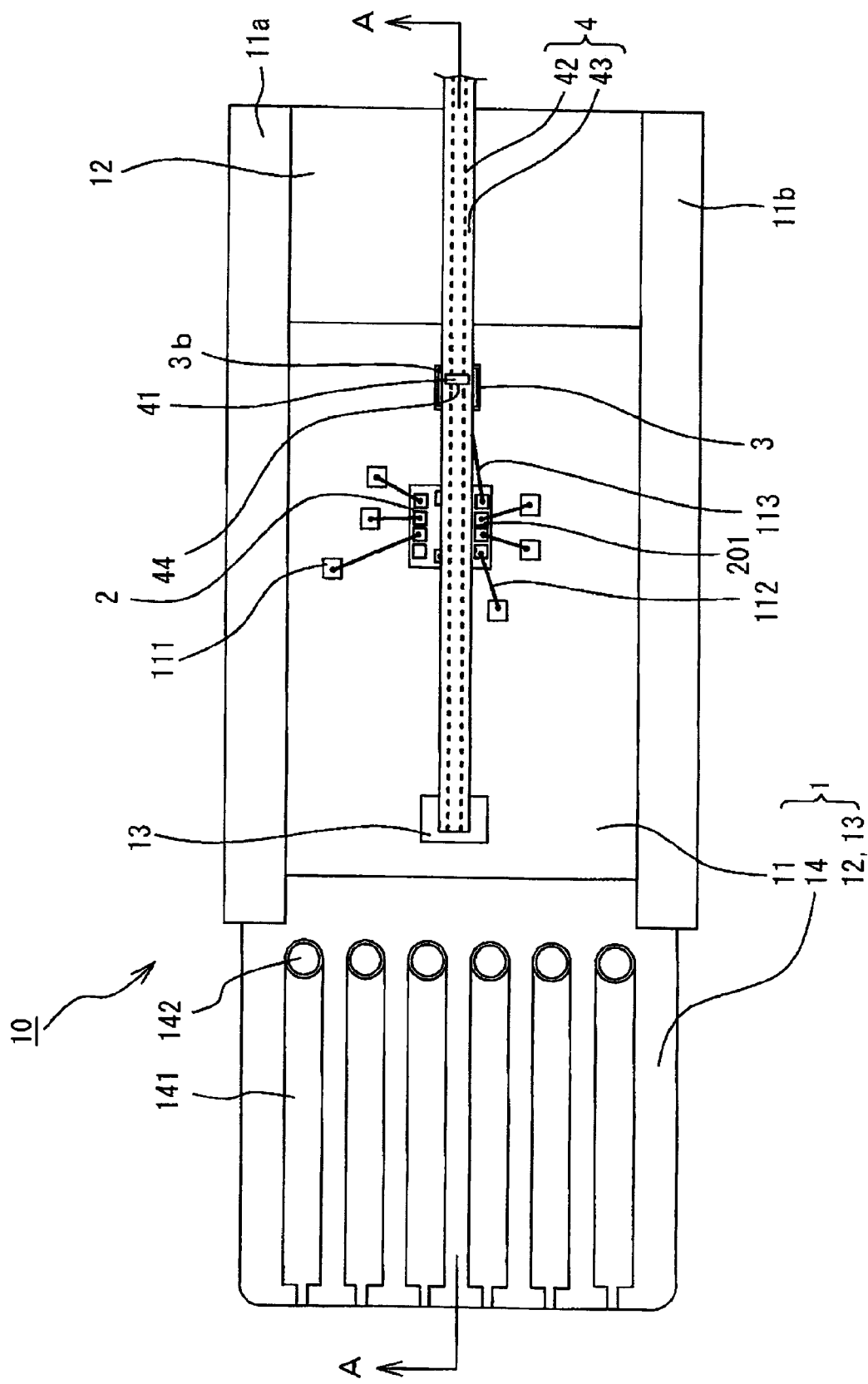
FIG. 2 is a plan view showing the optical transmission apparatus in FIG. 1 in a state where a lid is removed.
Figure 3:
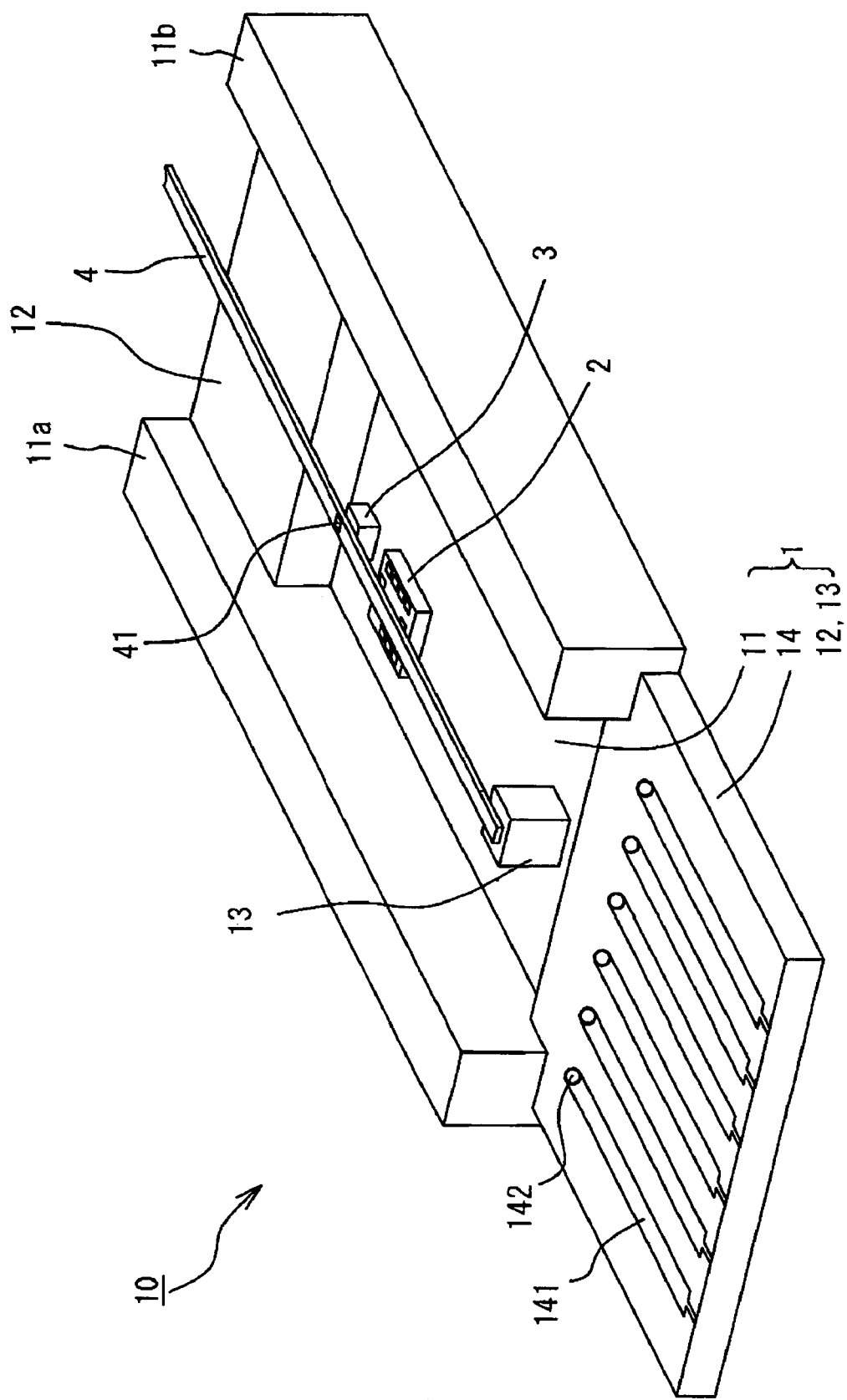
FIG. 3 is a perspective view showing the optical transmission apparatus in FIG. 1 in a state where the lid is removed.

FIG. 1A is a sectional front view and FIG. 1B is a right side view, showing an optical transmission apparatus in a first exemplary embodiment according to the invention. FIG. 2 is a plan view showing the optical transmission apparatus in FIG. 1 in a state where a lid is removed. FIG. 3 is a perspective view showing the optical transmission apparatus in FIG. 1 in a state where the lid is removed. It is to be noted that FIG. 1 is a sectional view taken along a line A-A in FIG. 2.

(Structure of the Optical Transmission Apparatus)

An optical transmission apparatus 10 includes a package body (substrate) 1, a driver IC 2 as an electronic component, and a VCSEL (Vertical Cavity Surface Emitting Laser) 3 as an optical element which are mounted on the package body 1, an optical waveguide 4 having flexibility and provided with a predetermined 45° mirror 41 which is an example of an optical path deflecting part, the optical waveguide 4 being installed in a center part of un upper face of the package body 1, and a lid 5 which is covered on the package body 1.

As shown in FIG. 1B, FIG. 2 and FIG. 3, the package body 1 includes a main board 11 having side walls 11a, 11b, and first and second waveguide holding parts 12, 13 in a convex shape for holding the optical waveguide 4 at the same height, and a connecting part 14 which is integrally provided with the main body 11 by molding or so at one end of the main board 11 in a longitudinal direction. The connecting part 14 is provided with a plurality of wiring patterns 141 for connection with the exterior and a plurality of (four, in this exemplary embodiment) through holes 142 formed at predetermined positions of the wiring patterns 141. Further, the main board 11 has a mounting region in which the aforethe driver IC 2 and the VCSEL 3 are mounted. In addition, lands 111 connected to the driver IC 2, and other wiring patterns and earth patterns (not shown) connected to the driver IC 2 and the VCSEL 3 are provided on the main board 11. Material suitable for the package body 1 is, for example, liquid crystal polymer.

The driver IC 2 is an IC which is provided with a circuit for driving the VCSEL 3 according to an electric signal which has been inputted. As shown in FIG. 2, a plurality of electrode pads 201 are provided on an upper face of the driver IC 2. The electrode pads 201 are connected to a plurality of the lands 111 and earth patterns which are provided on the main board 11 by way of bonding wires 112.

The VCSEL 3 has an emitting wavelength of 850 nm, for example, and includes a light emitting part 3c on its upper face 3b which is opposed to a mounting face 3a. The VCSEL 3 is so constructed that an optical path of the light emitting part 3c may be made horizontal by the 45° mirror 41 of the optical waveguide 4. This VCSEL 3 is connected to the driver IC 2 by way of a bonding wire 113. It is also possible to use a vertical cavity surface emitting diode or a light receiving element in place of the VCSEL 3 which is a light emitting element.

The lid 5 is provided for preventing dust from intruding onto the main board 11, and includes a top plate 51 having substantially the same size as the main board 11 and a peripheral wall part 52 to be fitted into the side walls 11a, 11b of the main board 11. In case where the optical transmission apparatus 10 is installed in a place free from dust, it is also possible to omit the lid 5.

(Structure of the Optical Waveguide)

FIG. 4A is a plan view and FIG. 4B is a sectional view taken along a line B-B in FIG. 4A, showing a structure of the optical waveguide. The optical waveguide 4 includes a core 42 formed of, for example, fluorinated polyimide, or high polymeric material of epoxy group, silicone group, polycarbonate group, PMMA (methacrylic resin) group, etc., and a clad 43 formed of film material such as fluorinated polyimide, resin of epoxy group, acryl group, styrene group, olefin group, vinyl chloride group having smaller refractive index than the core 42, and optical characteristics such as light permeability, mechanical strength, heat resistance, flexibility etc.

The core 42 has a thickness of 50 μm, for example. The clad 43 is provided surrounding the core 42 so as to have a thickness of 20 μm on upper and lower faces of the core 42.

Moreover, the optical waveguide 4 is provided with a through hole 44 in a region opposed to the light emitting part 3c of the VCSEL 3 and including the core 42. An inclined face at a lower side of the through hole 44 is formed as the 45° mirror 41. The through hole 44 may be formed by irradiation of excimer laser, for example.

As shown in FIGS. 1 to 3, the optical waveguide 4 is fixed to the first and second waveguide holding parts 12, 13 by an adhesive or the like, in a state where a distal end portion thereof is placed on the second waveguide holding part 13, and further, a portion close to the VCSEL 3 is placed on the first waveguide holding part 12.

(Method of Assembling the Optical Transmission Apparatus)

Then, a method of assembling the optical transmission apparatus 10 will be described. As a first step, the package body 1 in which the lands 111, wiring patterns 141, through holes 142, earth patterns and so on are preliminarily provided on the main board 11, the driver IC 2, the VCSEL 3, the optical waveguide 4, and the lid 5 are prepared.

Then, as shown in FIGS. 1 to 3, the driver IC 2 and the VCSEL 3 are mounted on the main board 11 of the package body 1 at predetermined positions. Thereafter, as shown in FIGS. 1 and 2, the predetermined electrode pads 201 of the driver IC 2 are connected to the lands 111 by the bonding wires 112, and the predetermined electrode pad 201 of the driver IC 2 is connected to the VCSEL 3 by the bonding wire 113.

Then, a ultraviolet hardening adhesive is applied to upper faces of the first and second waveguide holding parts 12, 13. Thereafter, the optical waveguide 4 is positioned on the first and second waveguide holding parts 12, 13. Specifically, the 45° mirror 41 is opposed to the light emitting part of the VCSEL 3 directly from above (centering), the distal end portion of the optical waveguide 4 is positioned on the second waveguide holding part 13, while the other portion is positioned in a center part of the main board 11, and further, the portion at the optical transmission side is positioned on the first waveguide holding part 12. In case where the positioning is determined, for example, by making a mark on the optical waveguide 4, by taking an image of this mark with a camera, and by processing the image which has been taken, this positioning may be made without an aid of a man's hand, and a positioning time may be reduced.

Then, an ultraviolet ray is irradiated to the ultraviolet hardening adhesive which has been applied, while the optical waveguide 4 is pressed against the first and second waveguide holding parts 12, 13, thereby to harden the ultraviolet hardening adhesive. In this manner, the optical waveguide 4 is bonded and fixed to the first and second waveguide holding parts 12, 13. Finally, the lid 5 is attached to the package body 1 so as to cover a surface of the main board 11. The lid 5 may be fixed to the main board 11 by engagement between concave and convex, bonding, screwing, etc. It is to be noted that the package body 1 may be completely sealed with the lid 5.

(Operation of the Optical Transmission Apparatus)

In FIG. 2, when an electric signal is inputted to the wiring patterns 141, the driver IC 2 is operated according to the electric signal, and the VCSEL 3 is driven by this driver IC 2, whereby an optical signal corresponding to the electric signal is emitted from the light emitting part 3c of the VCSEL 3 to the 45° mirror 41.

The optical signal from the VCSEL 3 is reflected by the mirror 41 to the core 42 which is at a right side of the 45° mirror 41 (in FIGS. 1 and 2). The optical signal spreads inside the core 42 to the right in FIG. 2, and transmitted to another optical transmission apparatus which is not shown.

(Modification of the Optical Waveguide)

FIG. 5A is sectional views showing modifications of the optical waveguide 4. The optical waveguide 4 as shown in FIG. 5A is so constructed that the core 42 is extended to a region which is not used for optical transmission, that is, a part of the core 42 existing at the left of the 45° mirror 41 in FIG. 5A is extended up to a position near the 45° mirror 41.

The optical waveguide 4 as shown in FIG. 5B is so constructed that an entire area of the region which is not used for optical transmission in FIG. 5A is formed as the clad 43.

The optical waveguide 4 as shown in FIG. 5C is so constructed that a V-shaped opening 45 is formed in place of the through hole 44 in FIG. 5B. This opening may be formed by irradiation of a laser beam, for example.

The optical waveguide 4 as shown in FIG. 5D is so constructed that an inclined face at an upper side of the through hole 44 in FIG. 4B is formed as a vertical wall face 4a of a through hole 46.

Second Exemplary Embodiment

Figure 6:
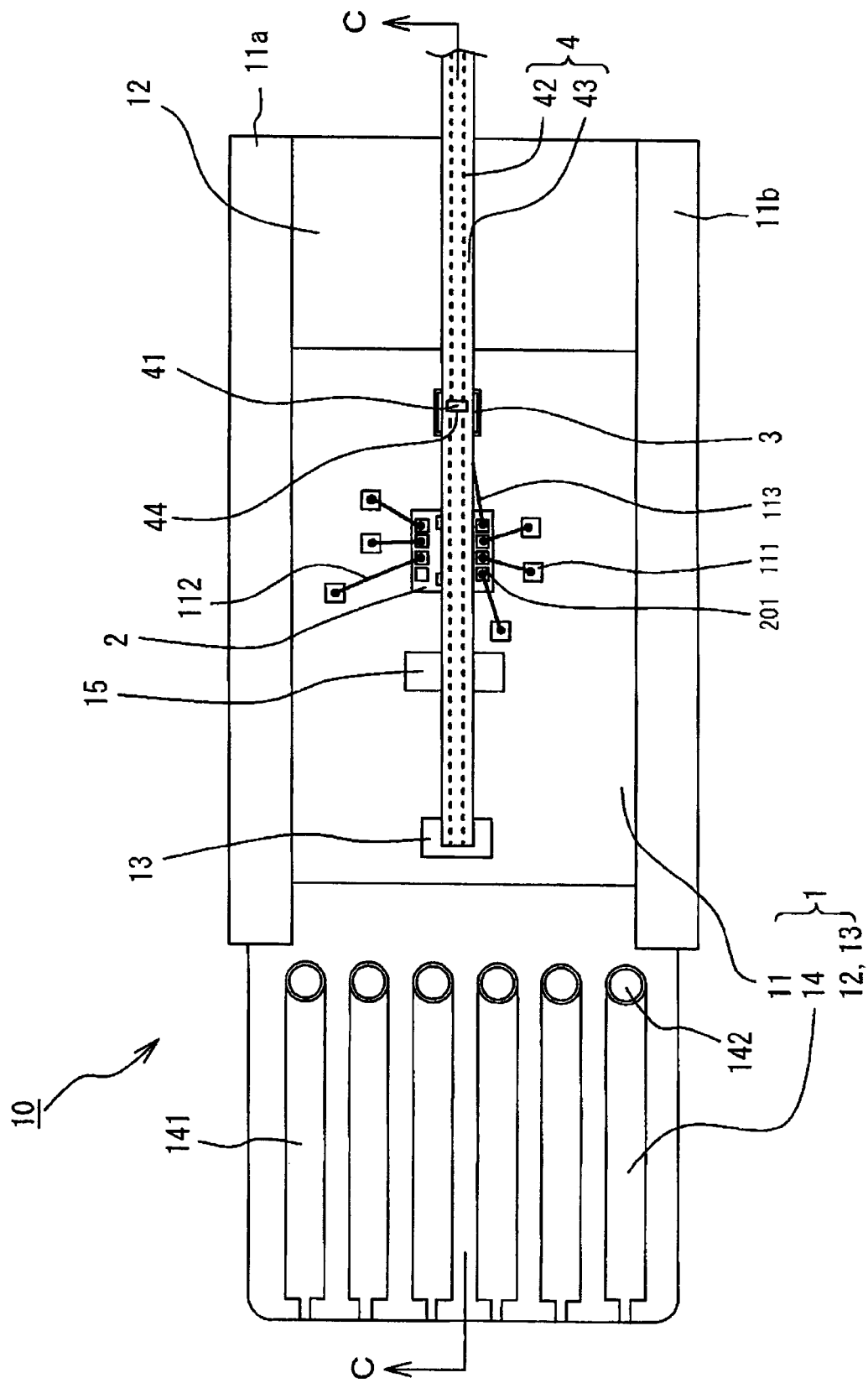
FIG. 6 is a plan view showing an optical transmission apparatus in a second exemplary embodiment according to the invention.
Figure 7:
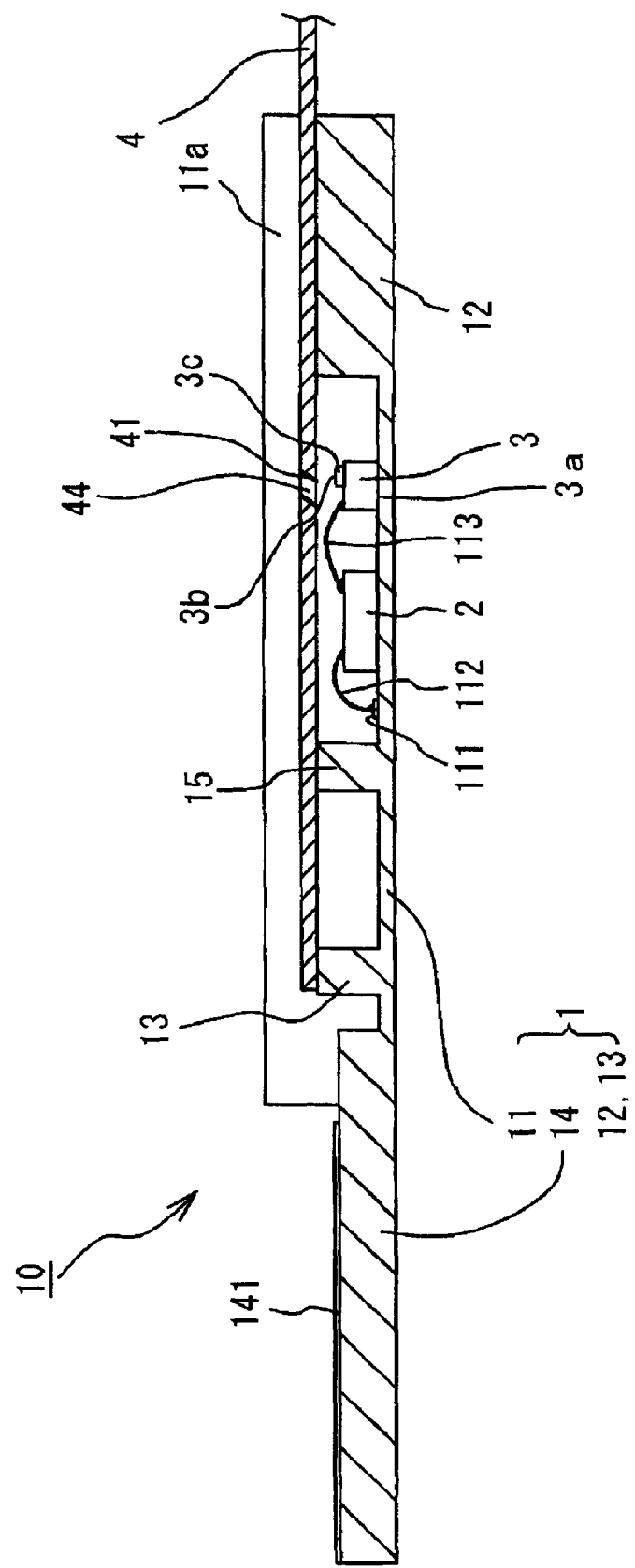
FIG. 7 is a sectional view of the optical transmission apparatus as shown in FIG. 6, taken along a line C-C.

FIG. 6 is a plan view showing an optical transmission apparatus in a second exemplary embodiment according to the invention, and FIG. 7 is a sectional view of the optical transmission apparatus as shown in FIG. 6, taken along a line C-C. This exemplary embodiment is different from the first exemplary embodiment in that positions for holding the optical waveguide 4 are increased, by providing a third waveguide holding part 15 near the driver IC 2 between the first waveguide holding part 12 and the second waveguide holding part 13. The other structure is substantially the same as in the first exemplary embodiment. Moreover, because assembling method and operation of the optical transmission apparatus 10 in this exemplary embodiment is substantially the same as those of the first exemplary embodiment, their description will be omitted. Although the number of the waveguide holding parts is three in this exemplary embodiment, it is also possible to increase the number according to necessity.

Third Exemplary Embodiment

Figure 8:
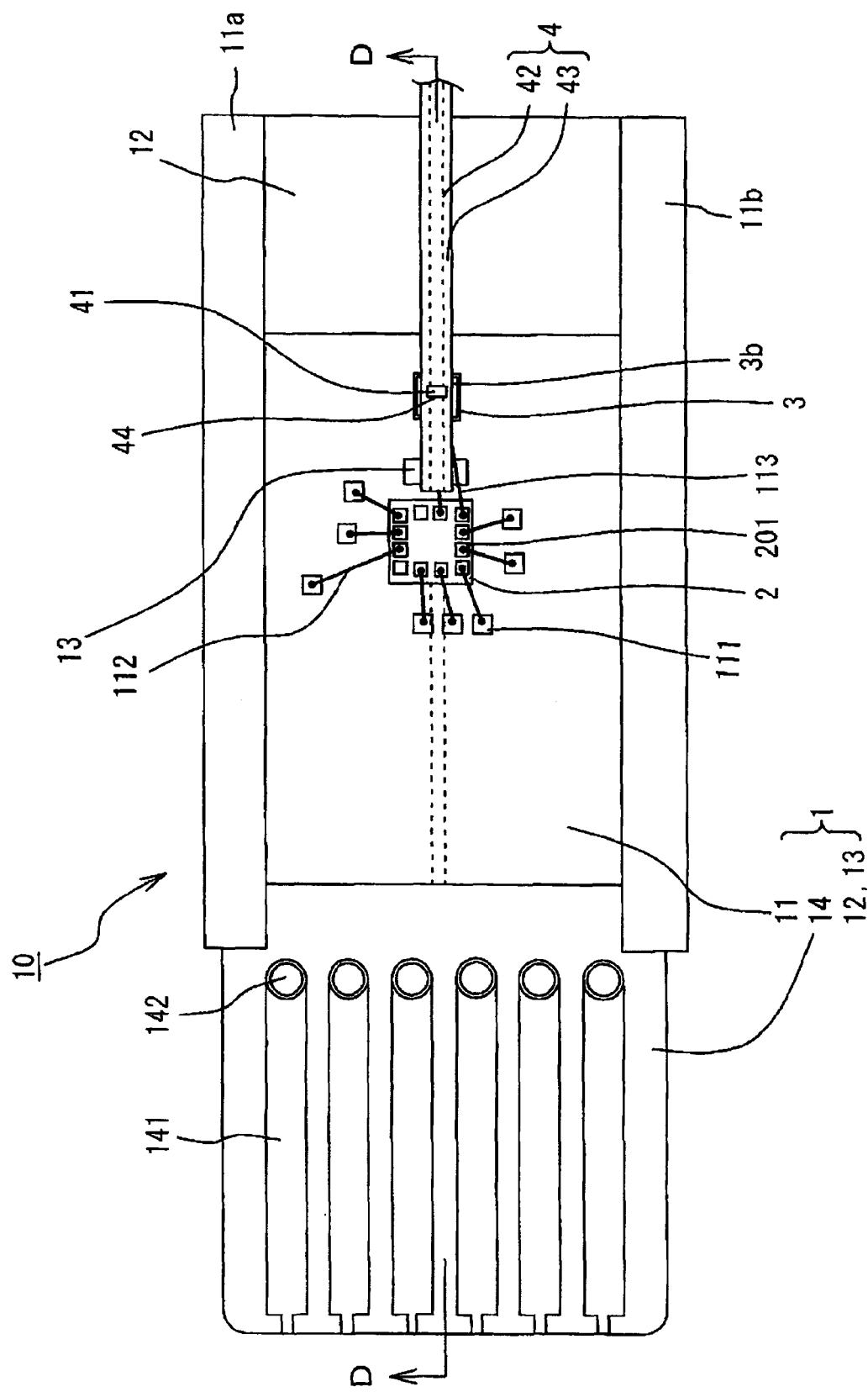
FIG. 8 is a plan view showing an optical transmission apparatus in a third exemplary embodiment according to the invention in a state where the lid is removed.
Figure 9:
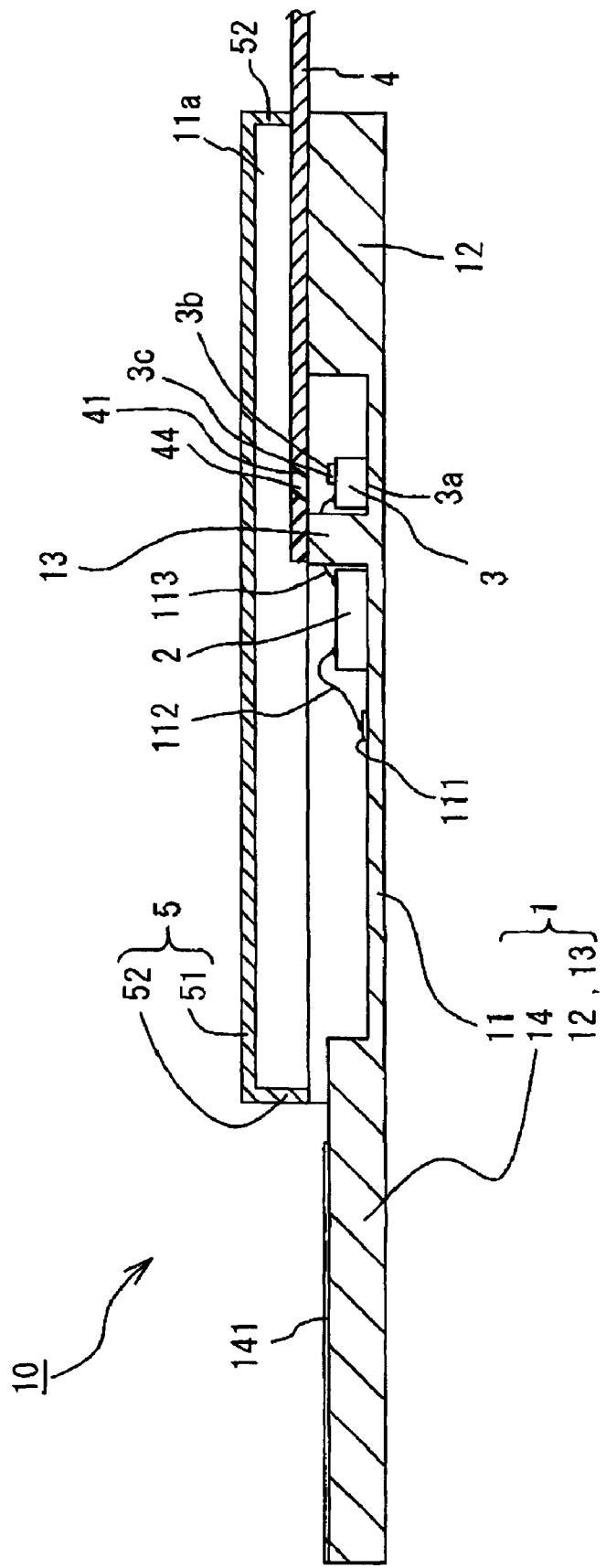
FIG. 9 is a sectional view of the optical transmission apparatus as shown in FIG. 8, taken along a line D-D, in a state where the lid is mounted.

FIG. 8 is a plan view showing the optical transmission apparatus in a third exemplary embodiment according to the invention, in a state where the lid is removed, and FIG. 9 is a sectional view of the optical transmission apparatus as shown in FIG. 8 taken along a line D-D, in a state where the lid is attached. This exemplary embodiment is different from the first exemplary embodiment in that the second waveguide holding part 13 is displaced to a position between the driver IC 2 and the VCSEL 3, and correspondingly, the optical waveguide 4 is shortened, so that the distal end of the optical waveguide 4 may be just above the second waveguide holding part 13. The other structure is substantially the same as in the first exemplary embodiment. Moreover, because assembling method and operation of the optical transmission apparatus 10 in this exemplary embodiment is substantially the same as those of the first exemplary embodiment, their description will be omitted.

Fourth Exemplary Embodiment

Figure 10:
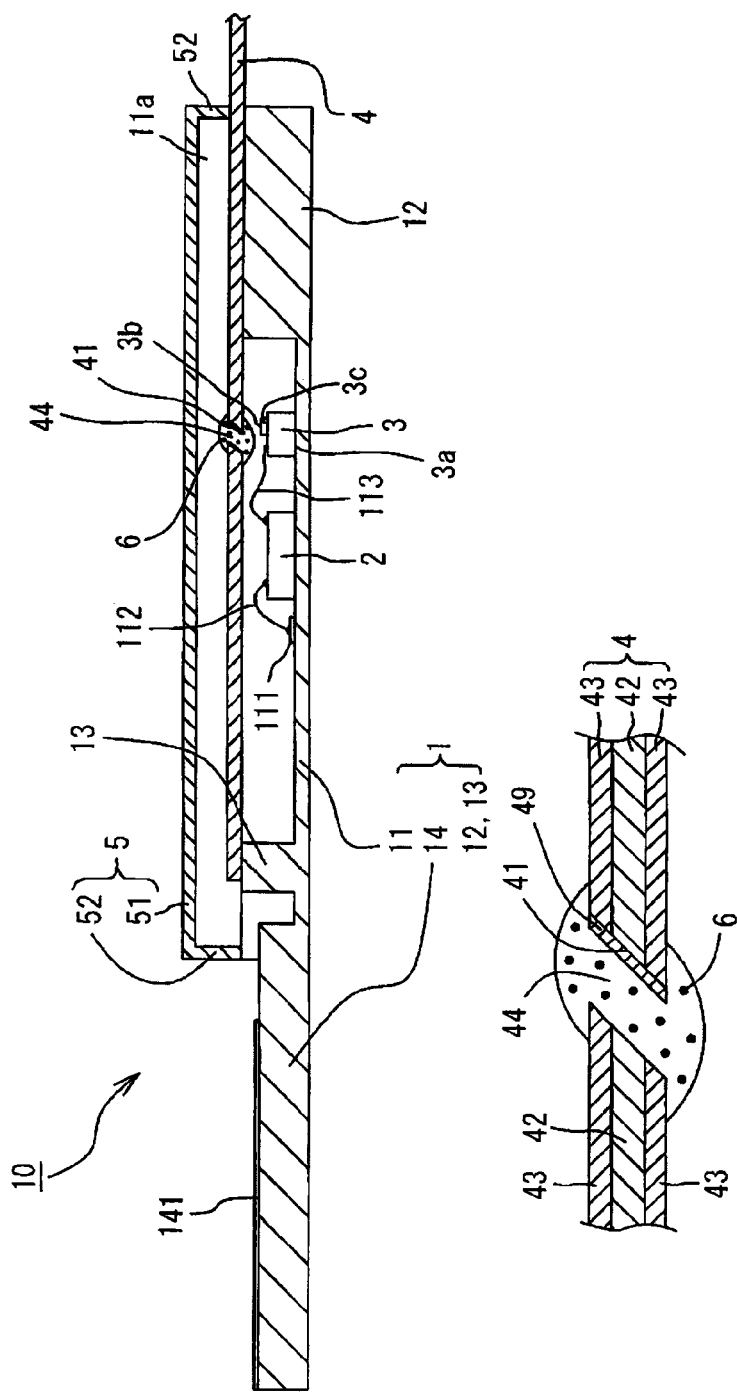
FIG. 10A is a sectional front view showing an optical transmission apparatus in a fourth exemplary embodiment according to the invention in a state where the lid is removed.
FIG. 10B is a sectional view showing details of a part including a through hole and a 45° mirror, showing an optical transmission apparatus in a fourth exemplary embodiment according to the invention in a state where the lid is removed.

FIG. 10A is a sectional front view and FIG. 10B is a sectional view showing details of the through hole and the 45° mirror, showing the optical transmission apparatus in a fourth exemplary embodiment according to the invention, in a state where the lid is removed. This exemplary embodiment is different from the first exemplary embodiment in that the 45° mirror 41 is evaporated with a metal film such as an Au film by spattering method, for the purpose of preventing dust from adhering to the 45° mirror 41 and the light emitting part of the VCSEL3, and the through hole 44 is filled with resin 6. The other structure is substantially the same as in the first exemplary embodiment. As the resin 6, for example, silicone resin "LPS-3400A/B", product of SHINETSU KAGAKU KK is recommended. Moreover, because assembling method and operation of the optical transmission apparatus 10 in this exemplary embodiment is substantially the same as those of the first exemplary embodiment, their description will be omitted.

Fifth Exemplary Embodiment

Figure 11:
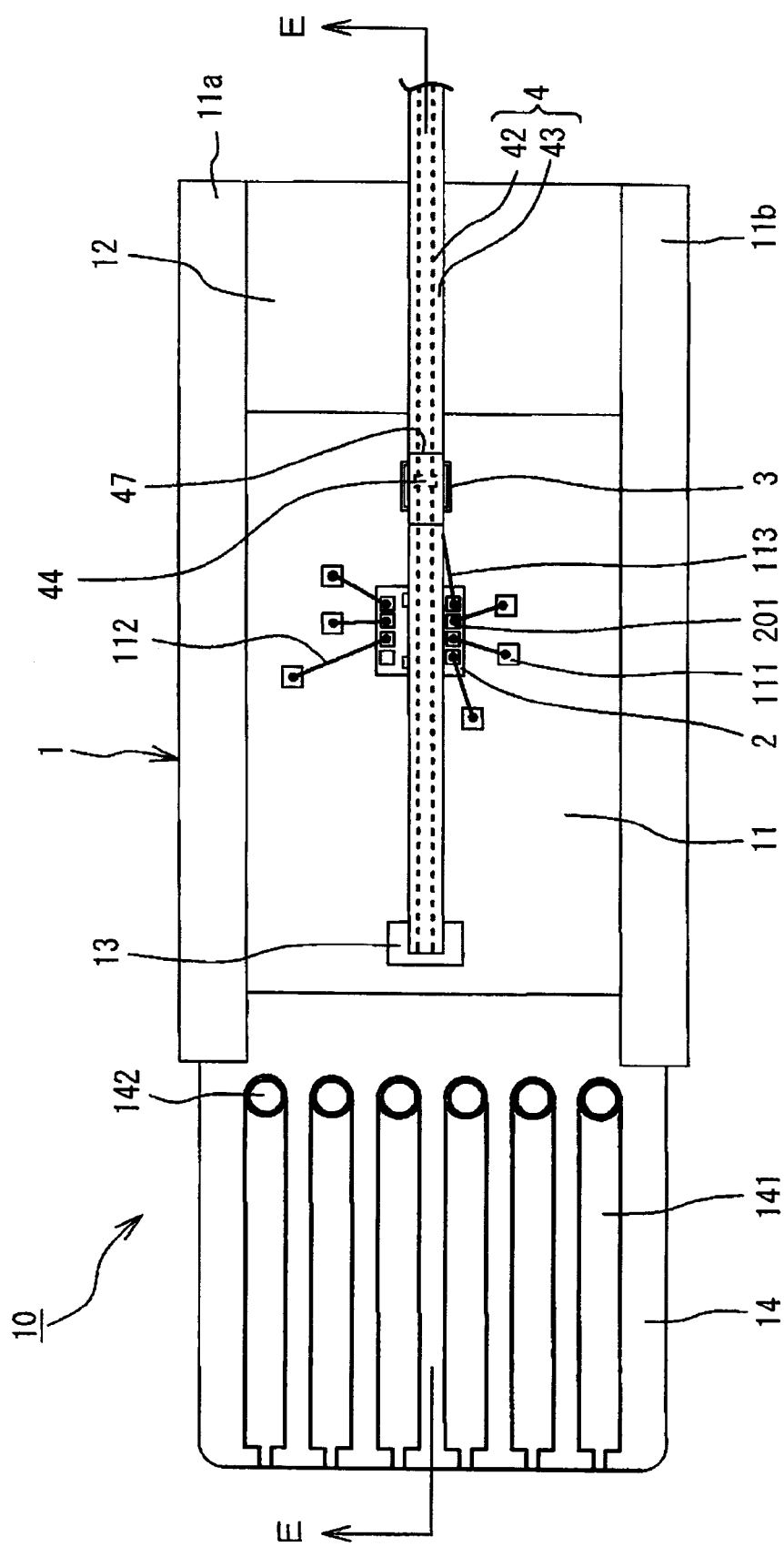
FIG. 11 is a plan view showing an optical transmission apparatus in a fifth exemplary embodiment according to the invention in a state where the lid is removed.
Figure 12:
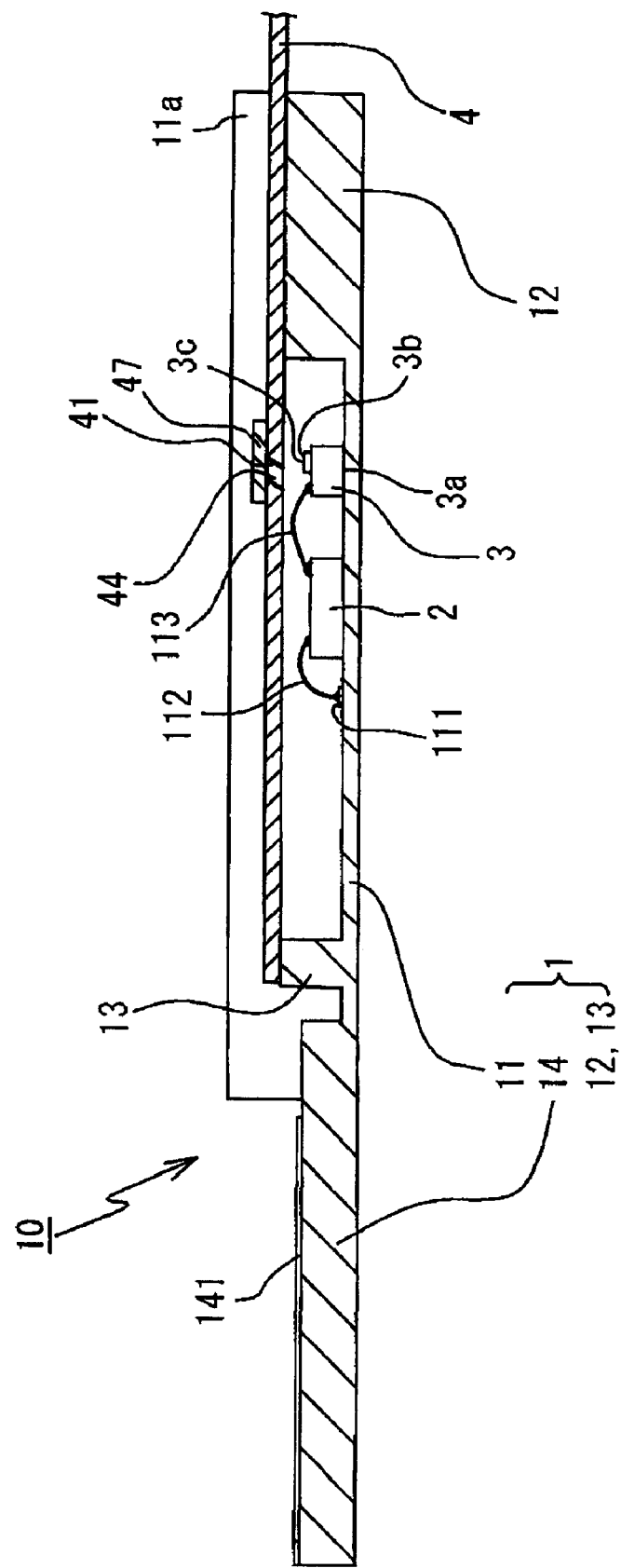
FIG. 12 is a sectional view of the optical transmission apparatus as shown in FIG. 11, taken along a line E-E.

FIG. 11 is a plan view showing the optical transmission apparatus in a fifth exemplary embodiment according to the invention, in a state where the lid is removed, and FIG. 12 is a sectional view of the optical transmission apparatus as shown in FIG. 11, taken along a line E-E. This exemplary embodiment is different from the first exemplary embodiment in that a cover 47 is provided for the purpose of reinforcing the optical waveguide 4 and preventing intrusion of dust, as a cover part having a shape of an elongated plate and the same width as the optical waveguide 4 so as to cover an open part of the through hole 44 and its surrounding. The other structure is substantially the same as in the first exemplary embodiment. The cover 47 may be formed of relatively hard material such as PET (polyethylene terephthalate). Moreover, because assembling method and operation of the optical transmission apparatus 10 in this exemplary embodiment is substantially the same as those of the first exemplary embodiment, their description will be omitted.

Sixth Exemplary Embodiment

Figure 13:
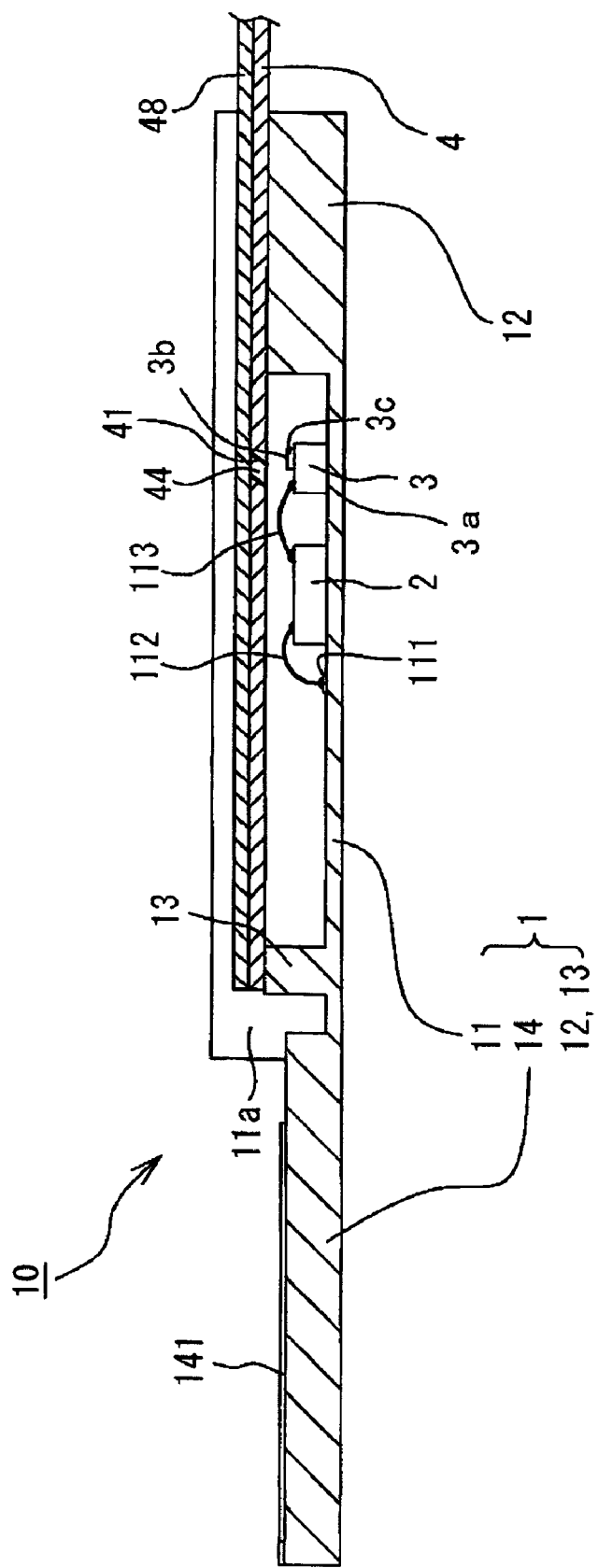
FIG. 13 is a sectional front view showing an optical transmission apparatus in a sixth exemplary embodiment according to the invention in a state where the lid is removed.

FIG. 13 is a sectional front view showing the optical transmission apparatus in a sixth exemplary embodiment according to the invention, in a state where the lid is removed. This exemplary embodiment is different from the fifth exemplary embodiment in that a cover 48 as a cover part which is formed by extending the cover 47 in a longitudinal direction is provided on the upper face of the optical waveguide 4 along the entire length thereof. The other structure is substantially the same as in the fifth exemplary embodiment. Although the lid 5 is not provided in this exemplary embodiment, it is desirable to provide the lid 5 in the same manner as in the first exemplary embodiment, for the purpose of preventing dust from intruding extensively over the main board 11. Moreover, because assembling method and operation of the optical transmission apparatus 10 in this exemplary embodiment is substantially the same as those of the first exemplary embodiment, their description will be omitted.

Although the cover 48 is provided along the entire length of the optical waveguide 4 in the structure of FIG. 13, the length of the cover 48 may be shortened. For example, it is possible to provide the cover 48 only in an area existing on the main board 11. In this manner, it is possible to construct so that flexibility of the optical waveguide 4 outside of the package body 1 may not be lost.

Seventh Exemplary Embodiment

Figure 14:
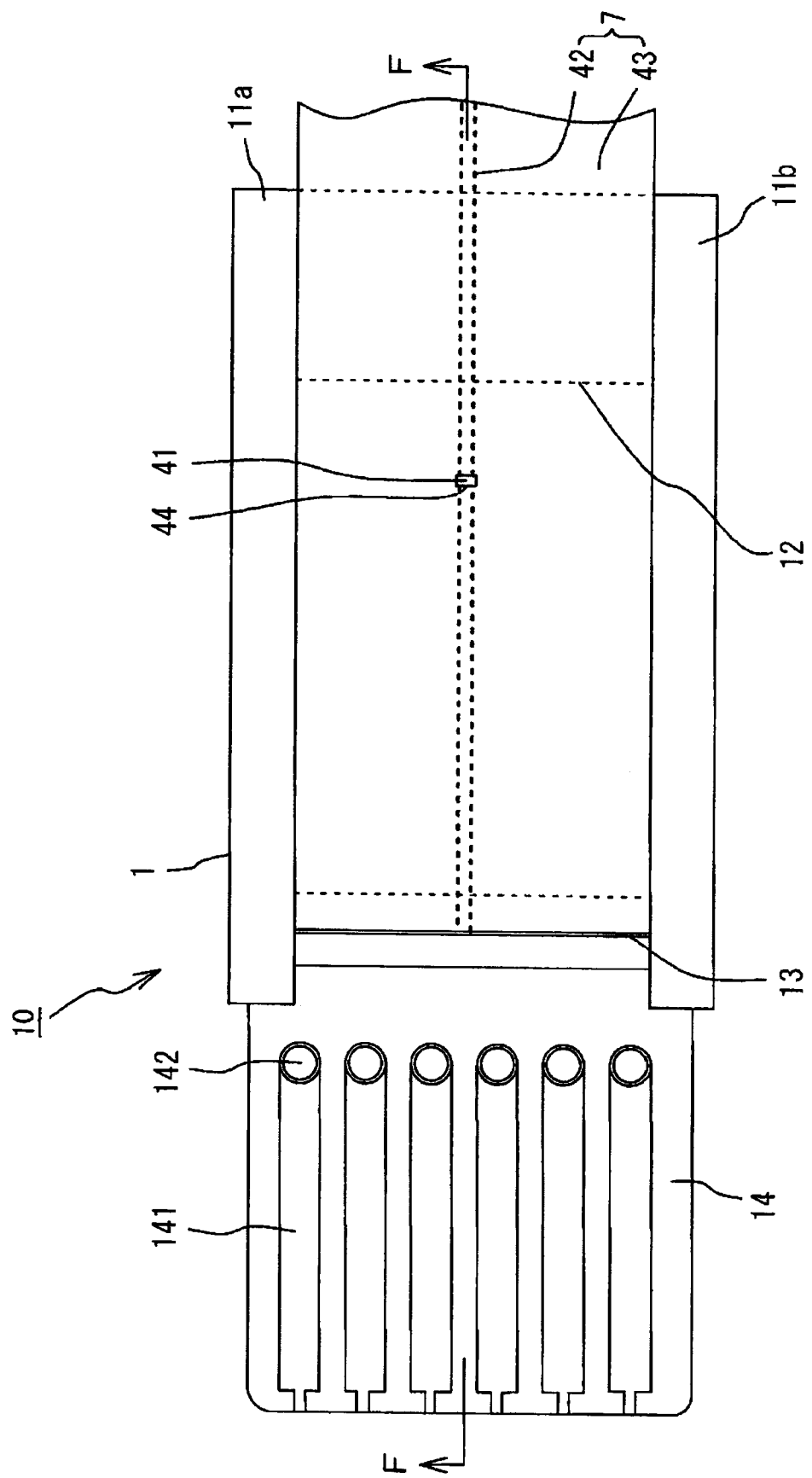
FIG. 14 is a plan view showing an optical transmission apparatus in a seventh exemplary embodiment according to the invention in a state where the lid is removed.
Figure 15:
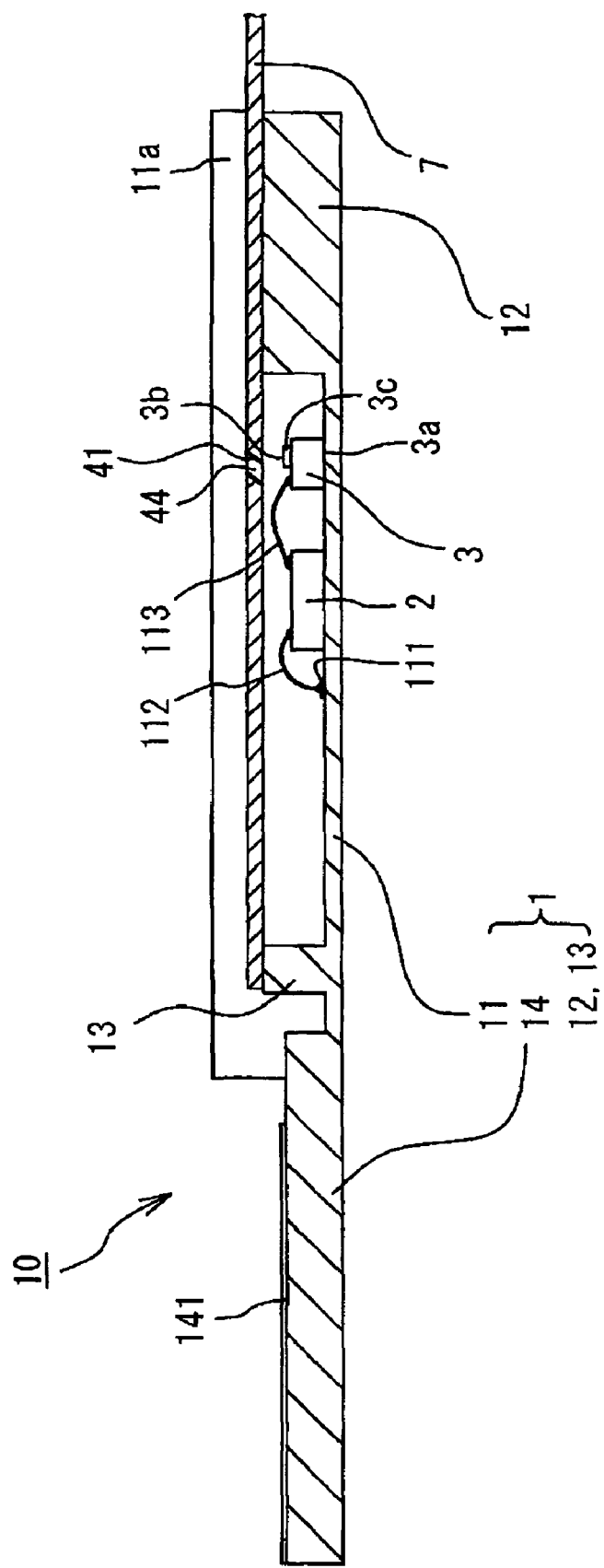
FIG. 15 is a sectional view of the optical transmission apparatus as shown in FIG. 14, taken along a line F-F.

FIG. 14 is a plan view showing the optical transmission apparatus in a seventh exemplary embodiment according to the invention, in a state where the lid is removed, and FIG. 15 is a sectional view of the optical transmission apparatus as shown in FIG. 14, taken along a line F-F. This exemplary embodiment is different from the first exemplary embodiment in that for the purpose of protecting the electronic components (including the driver IC 2, and resistors and condensers which are not shown) and the VCSEL 3 mounted on the main board 11, and for the purpose of preventing dust, an optical waveguide 7 in a sheet-like shape formed by spreading the clad 43 of the optical waveguide 4 so as to reach the side walls 11a, 11b is provided in place of the optical waveguide 4. The other structure is substantially the same as in the first exemplary embodiment. Moreover, because assembling method and operation of the optical transmission apparatus 10 in this exemplary embodiment is substantially the same as those of the first exemplary embodiment, their description will be omitted. Further, because the optical waveguide 7 may also serve as the lid 5 in this exemplary embodiment, it is also possible to omit the lid 5.

Eighth Exemplary Embodiment

Figure 16:
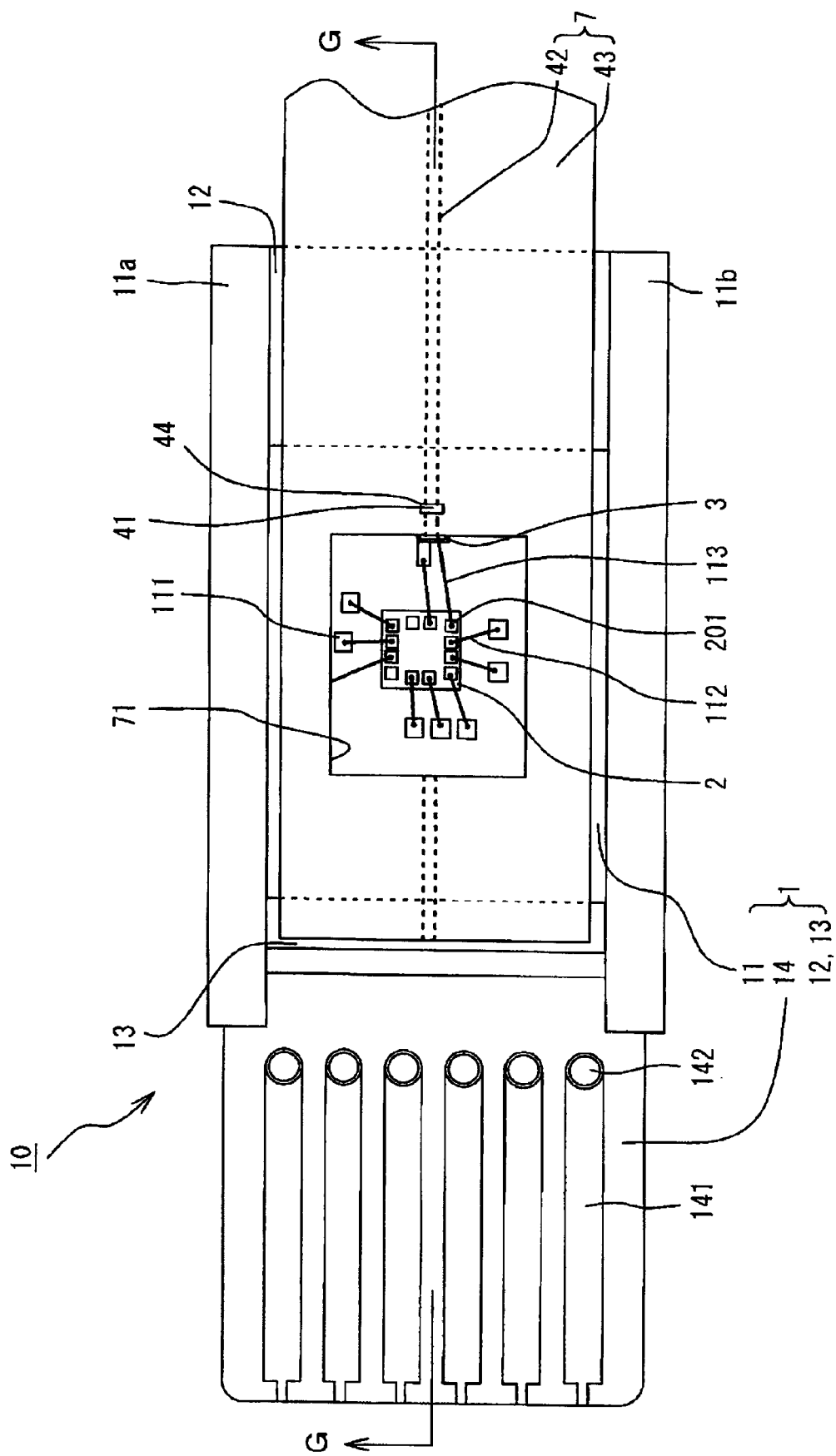
FIG. 16 a plan view showing an optical transmission apparatus in an eighth exemplary embodiment according to the invention in a state where the lid is removed.
Figure 17:
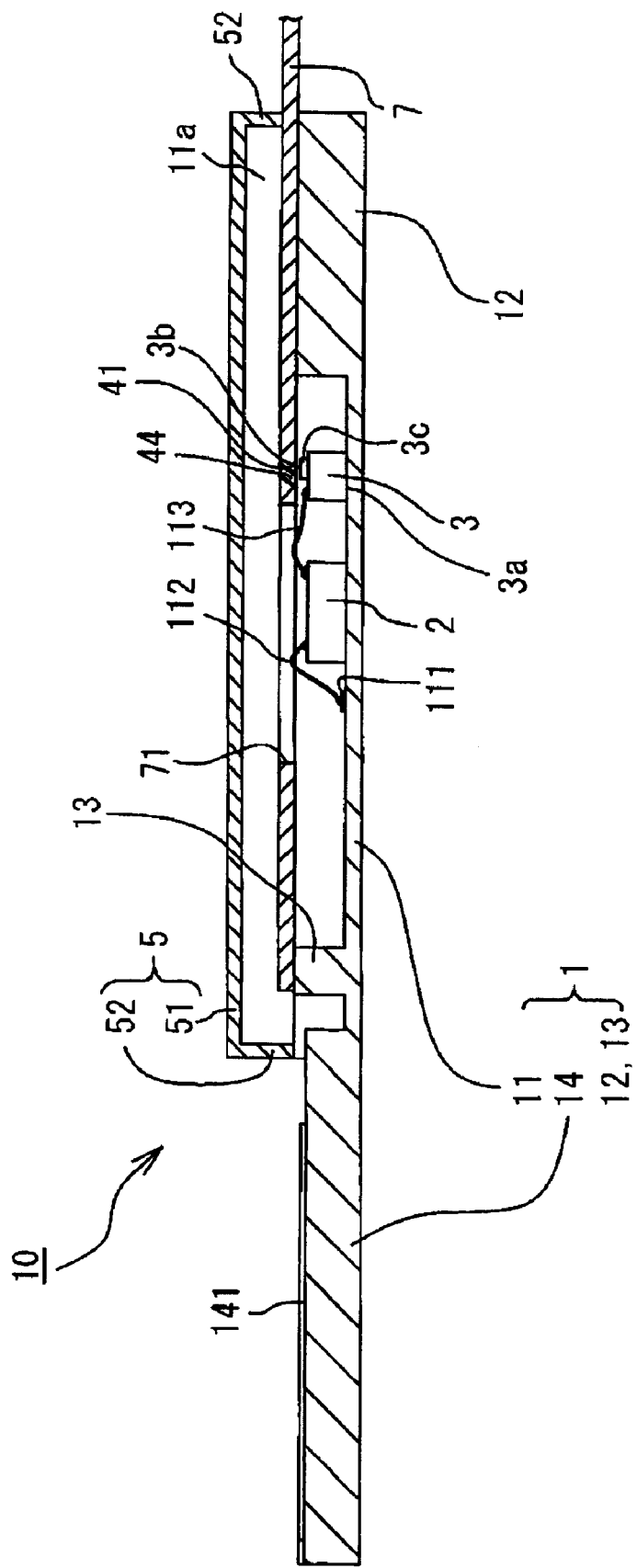
FIG. 17 is a sectional view of the optical transmission apparatus as shown in FIG. 16, taken along a line G-G in a state where the cover is mounted.

FIG. 16 is a plan view showing the optical transmission apparatus in an eighth exemplary embodiment according to the invention, in a state where the lid is removed, and FIG. 17 is a sectional view of the optical transmission apparatus as shown in FIG. 16, taken along a line G-G This exemplary embodiment is different from the seventh exemplary embodiment in that a square-shaped window 71 is provided so as to be opposed to the driver IC 2 of the optical waveguide 7 and its surrounding so that the bonding wires 112 connected to the driver IC 2 may be arranged so as not to touch a lower face of the optical waveguide 7, specifically, in such a manner that a distance between the driver IC 2 and the VCSEL 3, and the optical waveguide 7 may be shortened, or so as to deal with the driver IC 2 which is high. The other structure is substantially the same as in the seventh exemplary embodiment. Moreover, because assembling method and operation of the optical transmission apparatus 10 in this exemplary embodiment is substantially the same as those of the first exemplary embodiment, their description will be omitted.

In the eighth exemplary embodiment, the shape of the window 71 is not limited to the square shape, but any desired shape may be adopted. Moreover, there is no problem in case where the optical waveguide 4 comes into contact with the VCSEL 3, after the optical waveguide 4 has been mounted.

Ninth Exemplary Embodiment

Figure 18:
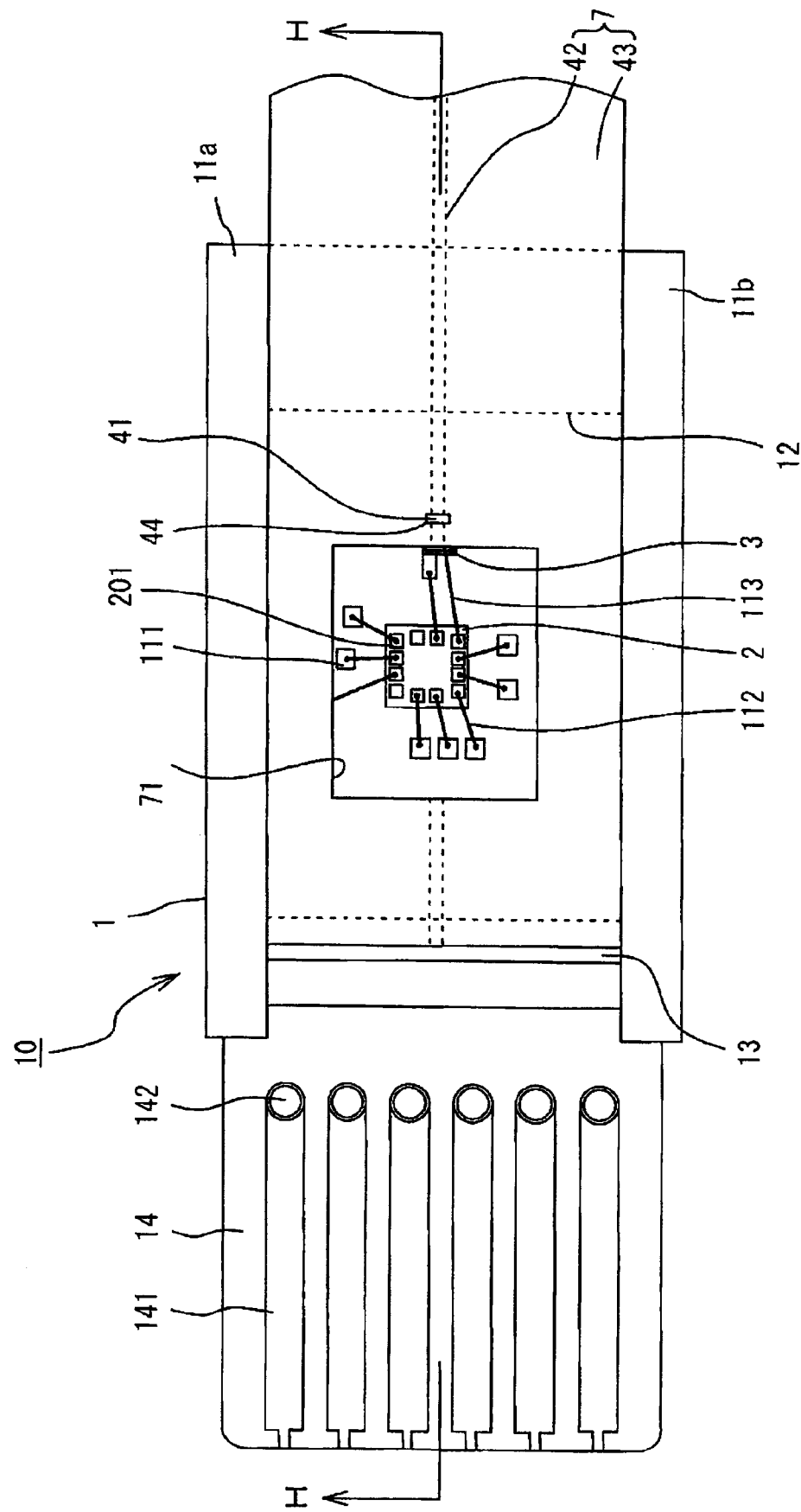
FIG. 18 is a plan view showing an optical transmission apparatus in a ninth exemplary embodiment according to the invention.
Figure 19:
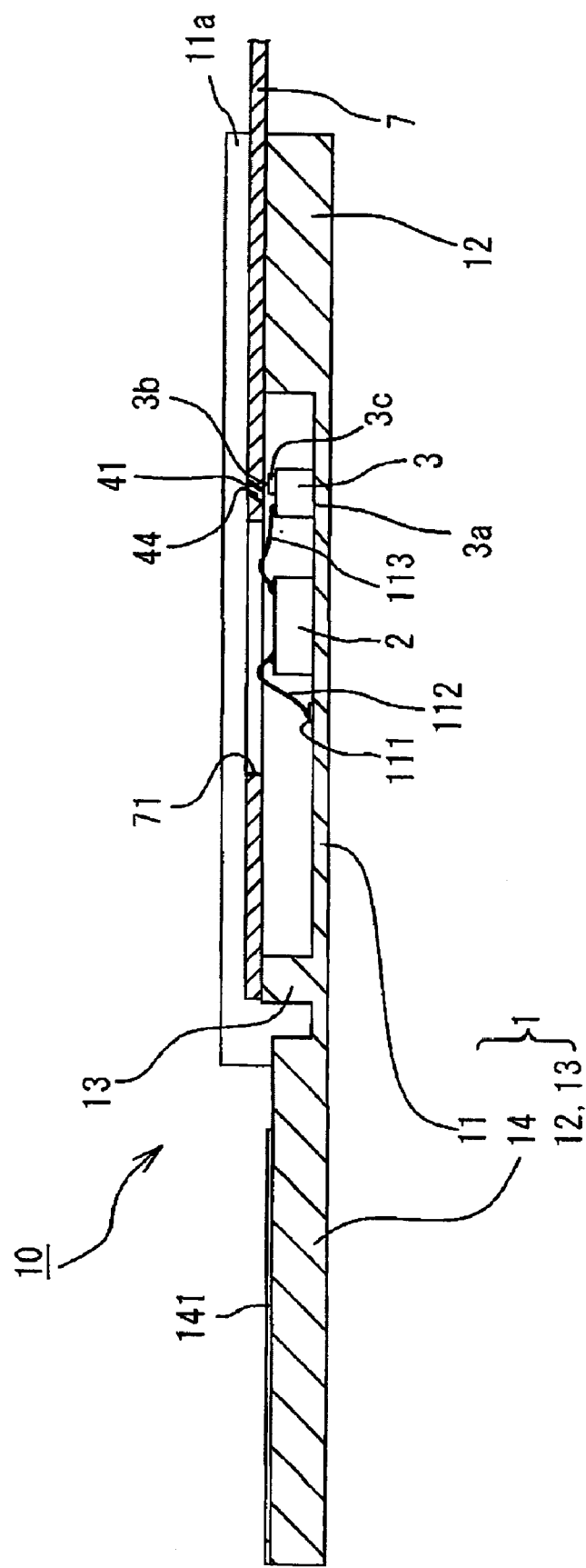
FIG. 19 is a sectional view of the optical transmission apparatus as shown in FIG. 18, taken along a line H-H.

FIG. 18 is a plan view showing the optical transmission apparatus in a ninth exemplary embodiment according to the invention, and FIG. 19 is a sectional view of the optical transmission apparatus as shown in FIG. 18, taken along a line H-H. This exemplary embodiment is different from the eighth exemplary embodiment in that the lid 5 is removed so as to cope with a case where the apparatus is installed in an environment where dust is scarcely received. The other structure is substantially the same as in the eighth exemplary embodiment. Moreover, because assembling method and operation of the optical transmission apparatus 10 in this exemplary embodiment is substantially the same as those of the first exemplary embodiment, their description will be omitted.

Tenth Exemplary Embodiment

Figure 20:
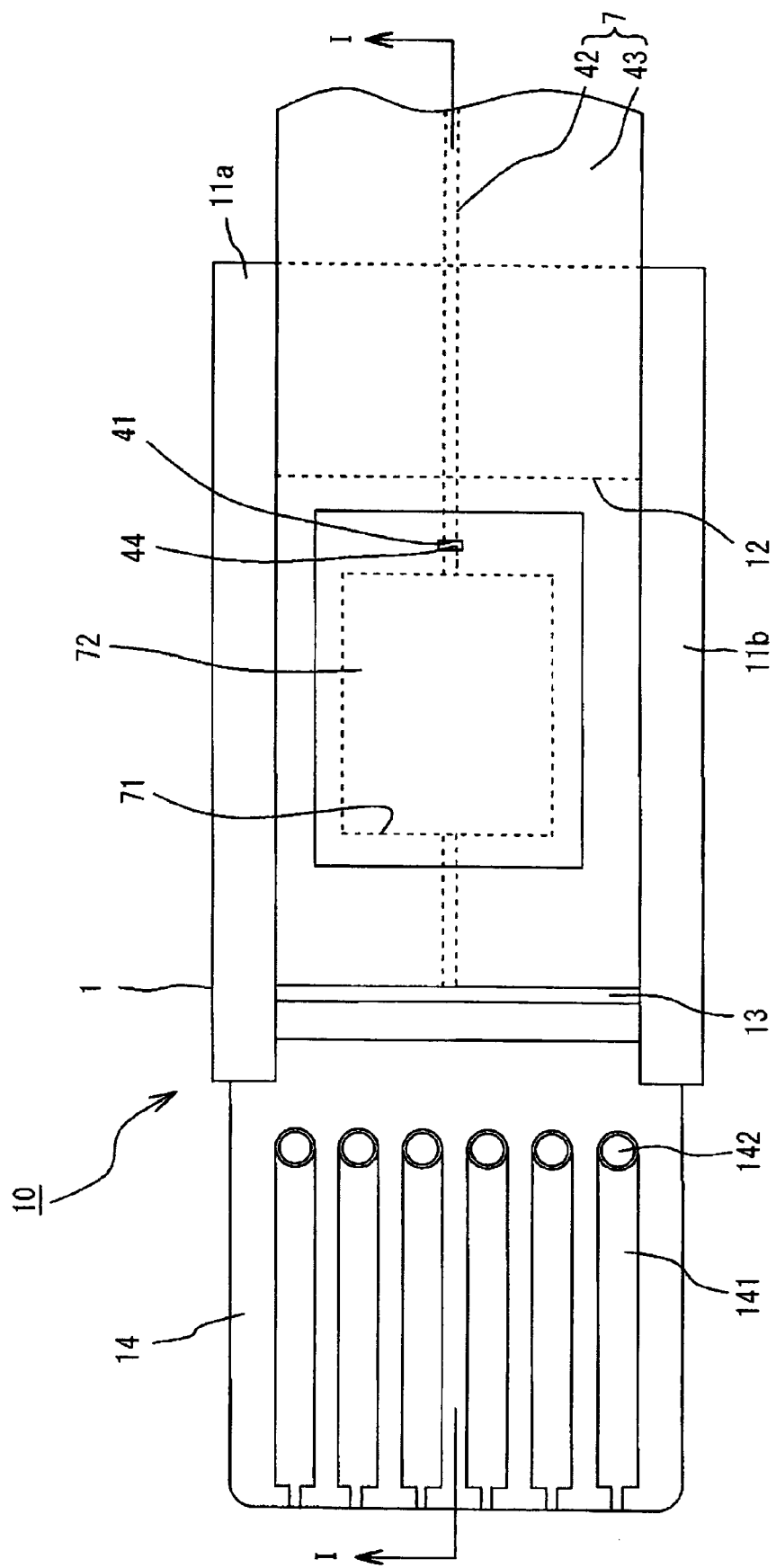
FIG. 20 is a plan view showing an optical transmission apparatus in a tenth exemplary embodiment according to the invention.
Figure 21:
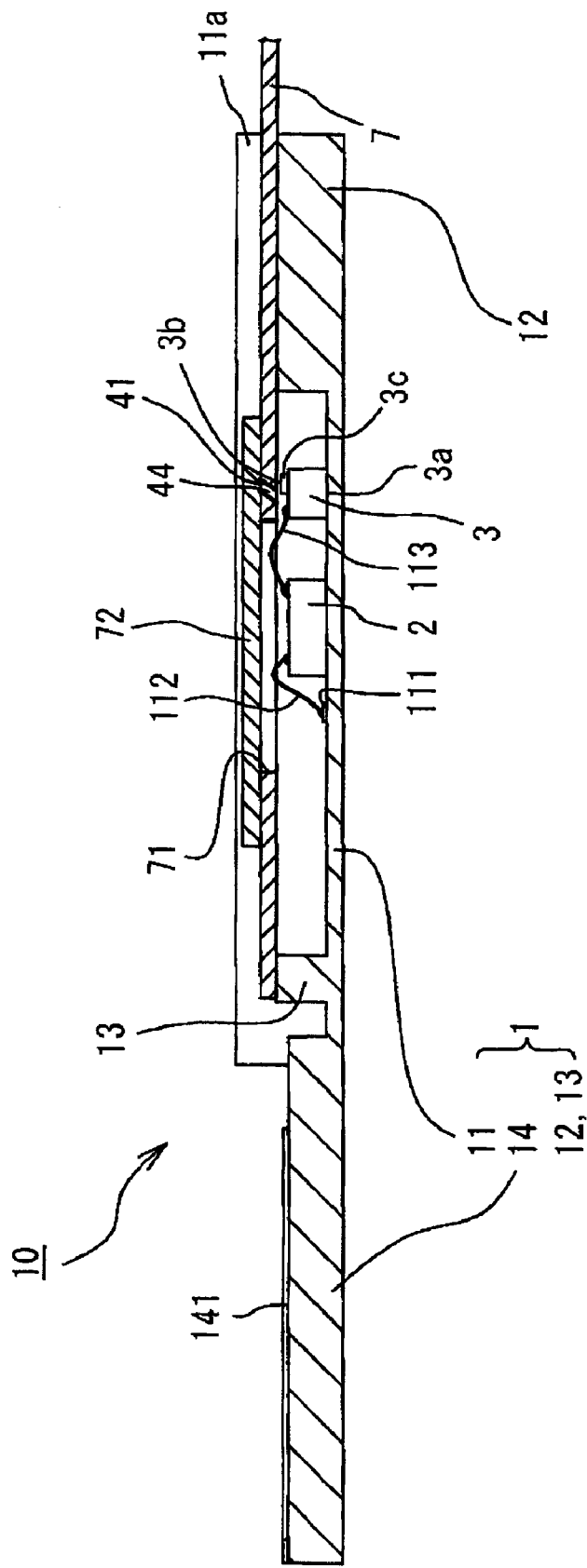
FIG. 21 is a sectional view of the optical transmission apparatus as shown in FIG. 20, taken along a line I-I.

FIG. 20 is a plan view showing the optical transmission apparatus in a tenth exemplary embodiment according to the invention, and FIG. 21 is a sectional view of the optical transmission apparatus as shown in FIG. 20, taken along a line I-I. This exemplary embodiment is different from the ninth exemplary embodiment in that a cover 72 as a cover part is provided on the upper face of the optical waveguide 7 in a manner of covering the window 71, so that dust or the like may not enter into the package body 1 through the window 71. The other structure is substantially the same as in the ninth exemplary embodiment. Although the lid 5 is not provided in this exemplary embodiment, it is possible to provide the lid 5 in the same manner as in the first exemplary embodiment. Moreover, because assembling method and operation of the optical transmission apparatus 10 in this exemplary embodiment is substantially the same as those of the first exemplary embodiment, their description will be omitted. It is to be noted that the shapes of the window 71 and the cover 72 are not limited to the square shape, but any desired shape may be adopted.

Eleventh Exemplary Embodiment

Figure 22:
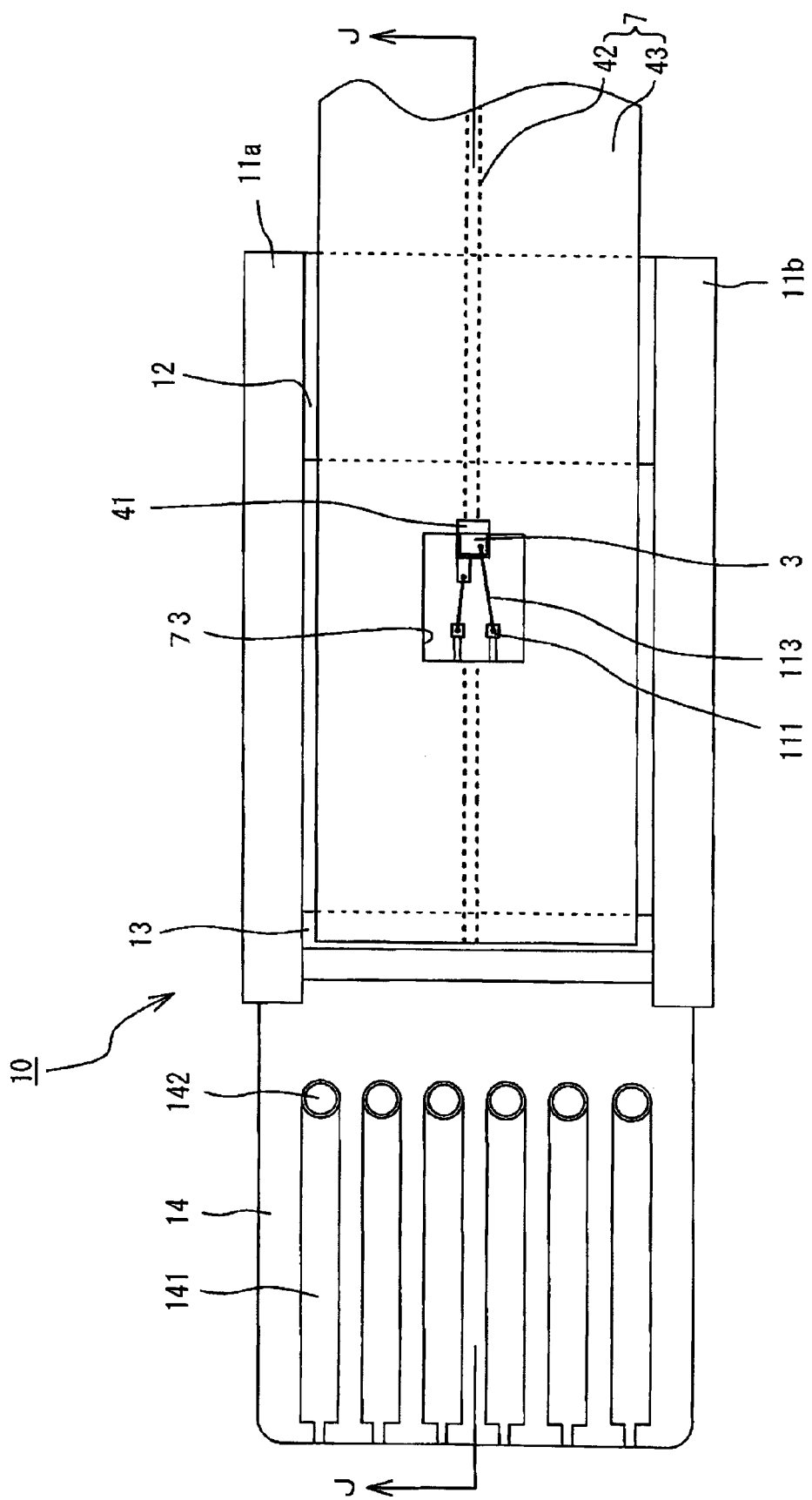
FIG. 22 is a plan view showing an optical transmission apparatus in an eleventh exemplary embodiment according to the invention, in a state where the lid is removed.
Figure 23:
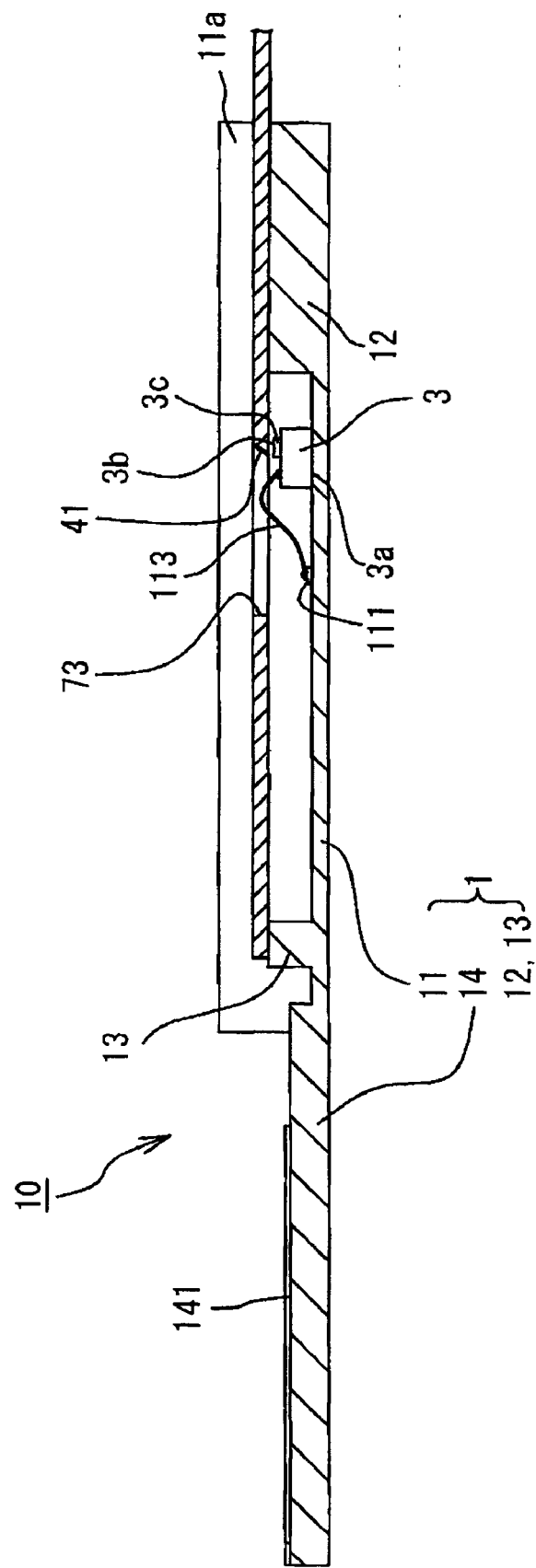
FIG. 23 is a sectional view of the optical transmission apparatus as shown in FIG. 22, taken along a line J-J.

FIG. 22 is a plan view showing the optical transmission apparatus in an eleventh exemplary embodiment according to the invention, in a state where the lid is removed, and FIG. 23 is a sectional view of the optical transmission apparatus as shown in FIG. 22, taken along a line J-J. An object of this exemplary embodiment is the structure of the optical transmission apparatus 10 which is not provided with the driver IC 2. This exemplary embodiment is different from the seventh exemplary embodiment in that the optical waveguide 7 is provided with a window 73 opposed to a position where the bonding wire 113 connected to the VCSEL 3 exists so as to cope with such a case where the VCSEL 3 is high, and the bonding wire 113 connected to the VCSEL is positioned high. The other structure is substantially the same as in the seventh exemplary embodiment. Moreover, because assembling method and operation of the optical transmission apparatus 10 in this exemplary embodiment is substantially the same as those of the first exemplary embodiment, their description will be omitted. It is to be noted that in FIGS. 22 and 23, the driver IC 2 may be mounted in the same manner as in the first exemplary embodiment, provided that the driver IC 2 has such a height that it does not get in touch with the optical waveguide 7, even though the wire bonding is conducted.

Twelfth Exemplary Embodiment

Figure 24:
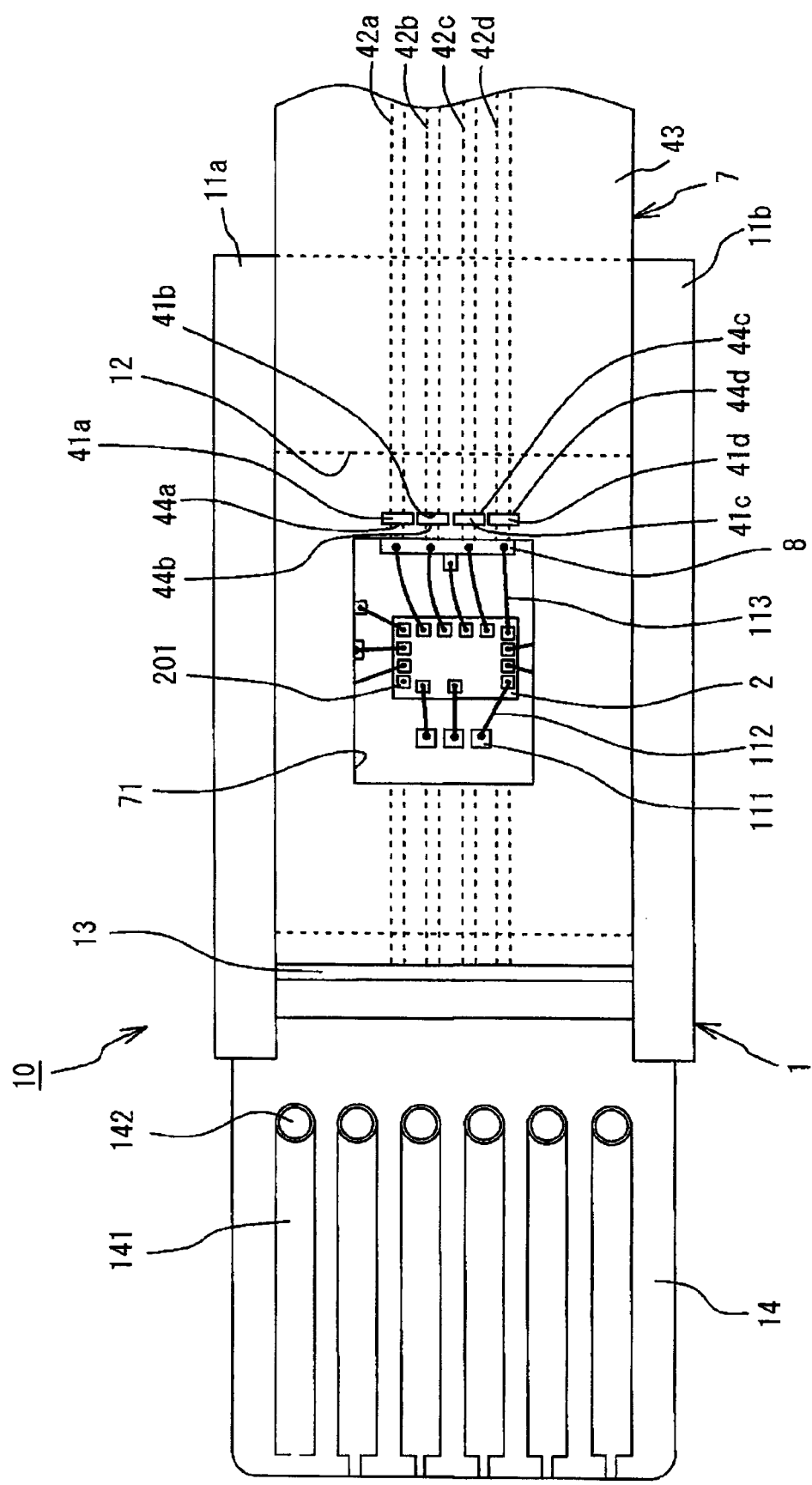
FIG. 24 is a plan view showing an optical transmission apparatus in a twelfth exemplary embodiment according to the invention.

FIG. 24 is a plan view showing the optical transmission apparatus in a twelfth exemplary embodiment according to the invention. This exemplary embodiment is different from the ninth exemplary embodiment in that a VCSEL 8 having four light emitting parts 3c is used in place of the VCSEL 3, and the number of the cores 42 and the number of the 45° mirror 41 are increased, specifically, four cores 42a to 42d and four mirrors 41a to 41d are used, whereby multi-bit (4-bits in this exemplary embodiment) is attained. The other structure is substantially the same as in the ninth exemplary embodiment. The cores 42a to 42d are provided in parallel with one another at a predetermined interval. Moreover, because assembling method and operation of the optical transmission apparatus 10 in this exemplary embodiment is substantially the same as those of the first exemplary embodiment, their description will be omitted.

Although the respective numbers of the light emitting parts 3c of the VCSEL 8 and the cores 42 are four in the twelfth exemplary embodiment, any desired number may be adopted. Moreover, although the cores 42a to 42d and the 45° mirrors 41a to 41d are arranged in a row in a lateral direction, they may be provided in a staggered arrangement, for example.

Thirteenth Exemplary Embodiment

Figure 25:
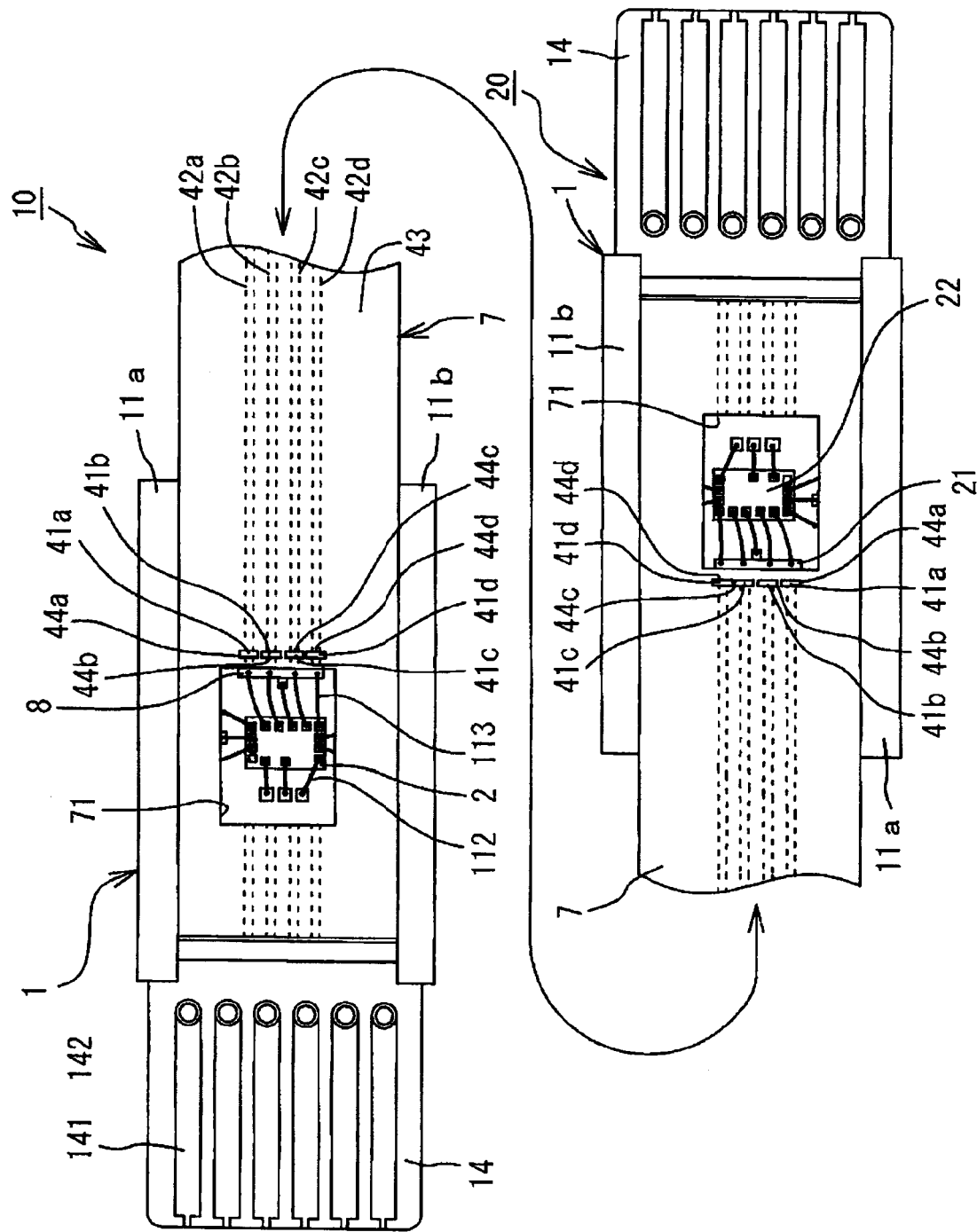
FIG. 25 is a plan view showing an optical transmission apparatus in a thirteenth exemplary embodiment according to the invention.

FIG. 25 is a plan view showing the optical transmission apparatus in a thirteenth exemplary embodiment according to the invention. In this exemplary embodiment, an optical transmission apparatus 20 having the same structure as the optical transmission apparatus 10 as shown in the twelfth exemplary embodiment (but the VCSEL 8 is substituted with a light emitting element 21 of 4-bits, and the driver IC 2 is substituted with a photoelectric conversion IC 22) is connected to the optical transmission apparatus 10 by way of the optical waveguide 7 having a predetermined length. In this manner, connecting work of the optical waveguide 7 between the optical transmission apparatus 10 and the optical transmission apparatus 20 is made unnecessary. The optical transmission apparatus 20 is provided, for example, on another board in the same appliance.

Fourteenth Exemplary Embodiment

Figures 26A, 26B:
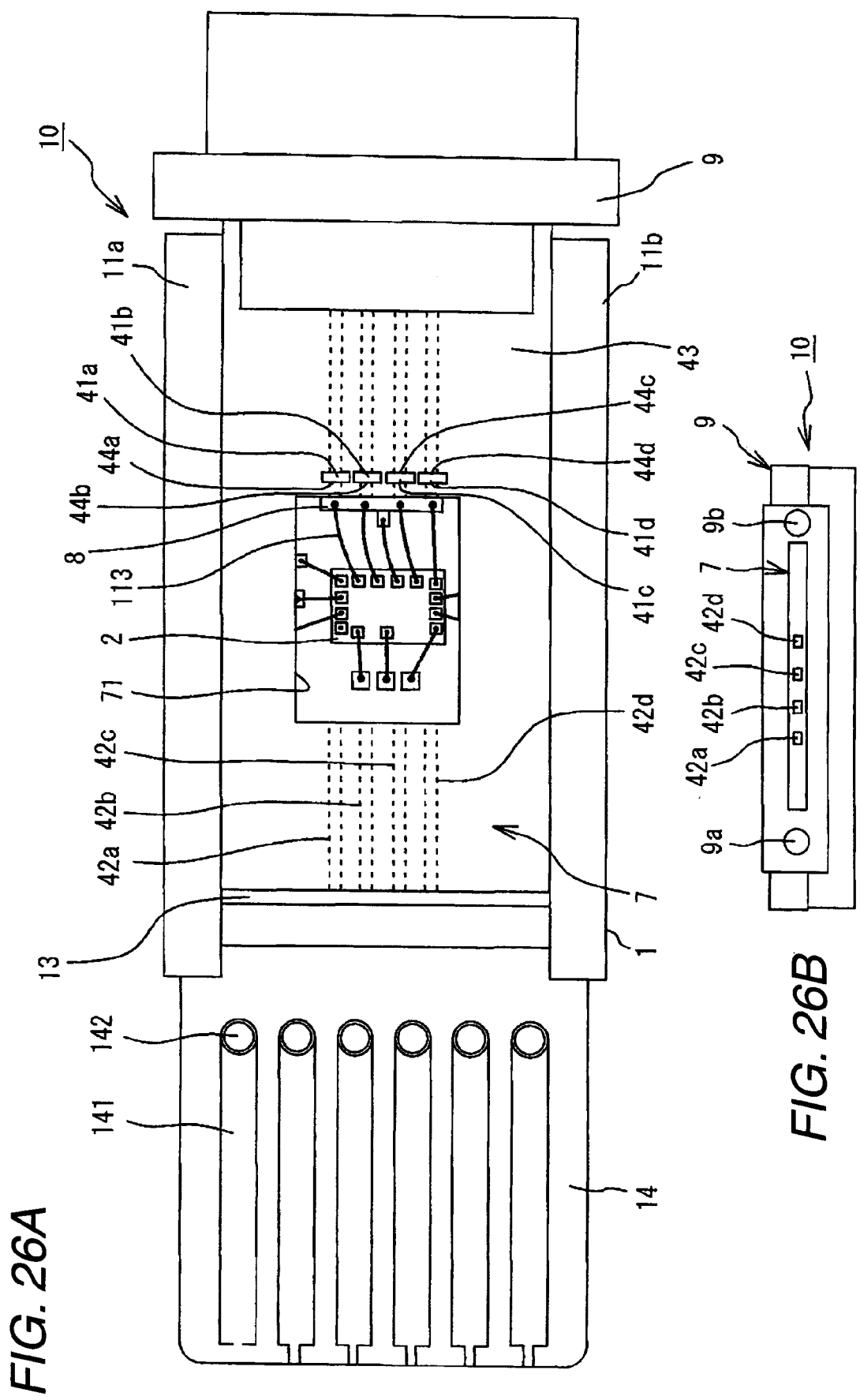
FIG. 26A is a front view showing an optical transmission apparatus in a fourteenth exemplary embodiment according to the invention.
FIG. 26B is a right side view showing an optical transmission apparatus in a fourteenth exemplary embodiment according to the invention.

FIG. 26A is a plan view and FIG. 26B is a right side view of FIG. 26A, showing the optical transmission apparatus in a fourteenth exemplary embodiment according to the invention. This exemplary embodiment is different from the twelfth exemplary embodiment in that the optical waveguide 7 has a length corresponding to the length of the main board 11, and a connector 9 having pin holes 9a, 9b is attached to an end part at the optical transmission side. The connector 9 is, for example, a PMT optical connector (MT connector for a high polymeric waveguide) to be connected to another connector by inserting metallic pins (not shown) into the pin holes 9a, 9b. According to this structure, an optical transmission medium (such as the optical waveguide) having a desired length may be connected to the connector 9, and the optical transmission apparatus 10 may be easily removed or exchanged from the appliance.

Fifteenth Exemplary Embodiment

Figure 27:
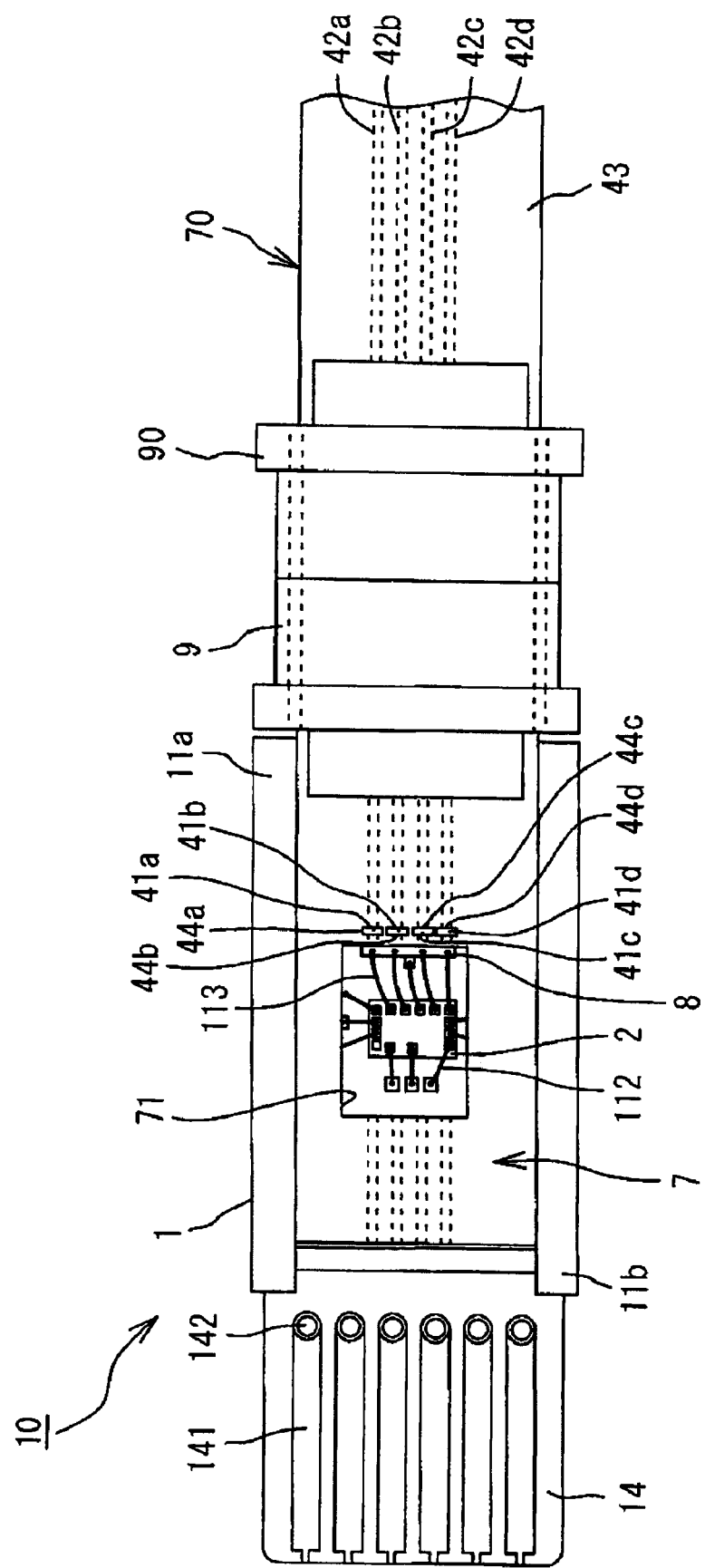
FIG. 27 is a plan view showing an optical transmission apparatus in a fifteenth exemplary embodiment according to the invention.

FIG. 27 is a plan view showing the optical transmission apparatus in a fifteenth exemplary embodiment according to the invention. This optical transmission apparatus 10 is different from the optical transmission apparatus 10 in the fourteenth exemplary embodiment (FIG. 26) in that a connector 90 which may be coupled to the connector 9 is attached to an optical wavelength 70 composed of the cores 41a to 41b and the clad 43, and this connector 90 is attached to the connector 9. According to this structure, exchange the optical waveguide 70 and exchange of the optical transmission apparatus 10 may be easily performed, and the optical waveguide 70 having a desired length may be connected.

Sixteenth Exemplary Embodiment

Figure 28:
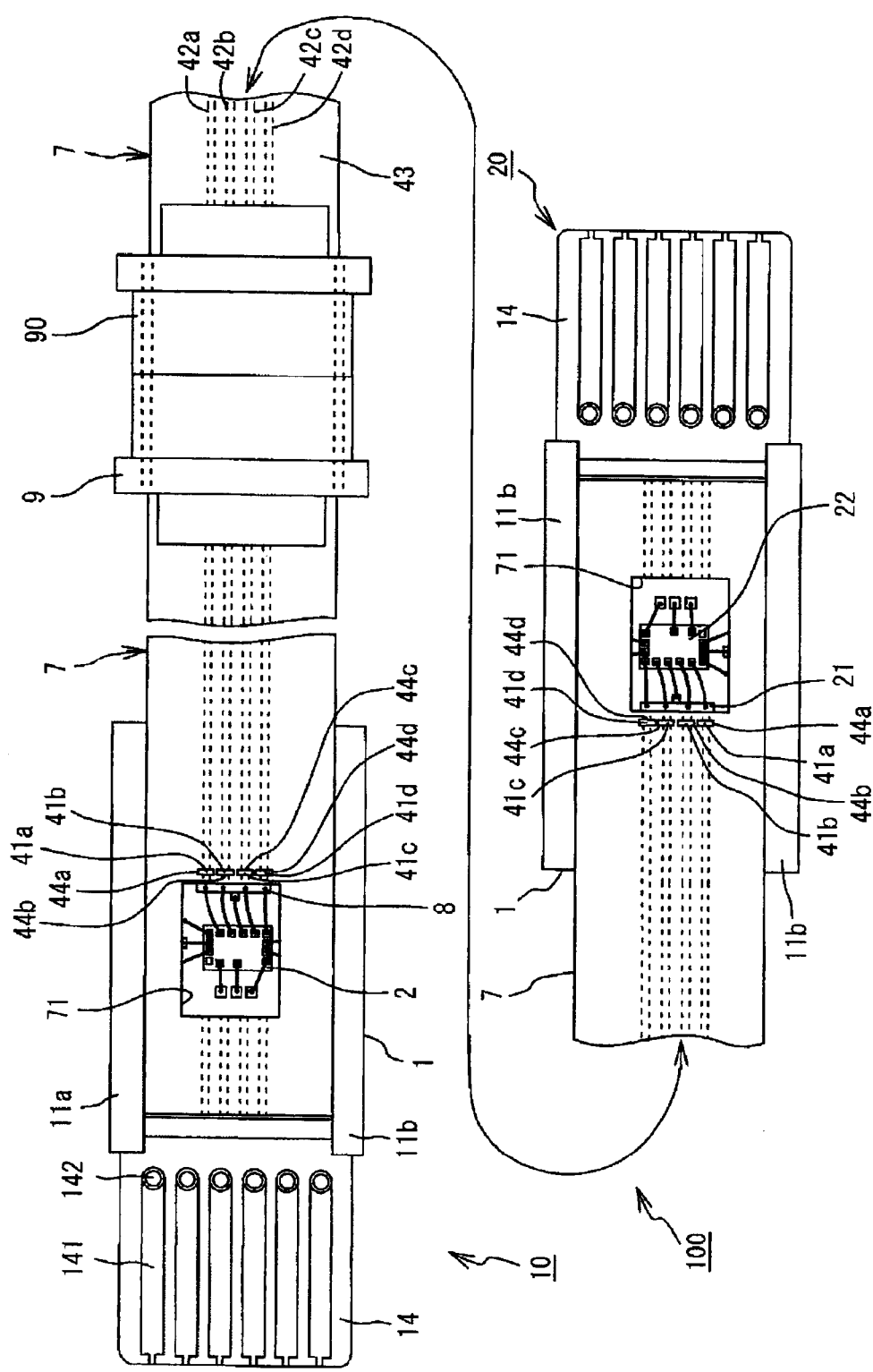
FIG. 28 is a plan view showing an optical transmission system in a sixteenth exemplary embodiment according to the invention.

FIG. 28 is a plan view showing the optical transmission system in a sixteenth exemplary embodiment according to the invention. An optical transmission system 100 in this exemplary embodiment is different from the thirteenth exemplary embodiment (FIG. 25) in that the connectors 9 and 90 as shown in the fifteenth exemplary embodiment (FIG. 27) are provided on a halfway of the optical waveguide 7, so that the optical transmission apparatus 10 and the optical transmission apparatus 20 may be independently removed or exchanged.

Other Exemplary Embodiments

The invention is not limited to the above described exemplary embodiments, but various modifications may be made within a scope not deviating from the gist of the invention. For example, the constituent elements in the respective exemplary embodiments may be combined as desired. For example, the respective structures of the optical waveguide 4 as shown in FIG. 5 may be also applied to the other exemplary embodiments.

Moreover, although in the above described exemplary embodiments, the first, second, and third waveguide holding parts 12, 13, 15 are integrally provided on the main board 11, it is also possible to produce these waveguide holding parts as separate components, and to fix them to the main board 11 with an adhesive or the like.

Although in the above described exemplary embodiments, the six wiring patterns 141 and the six through holes 142 are provided in the connecting part 14, the desired number may be adopted.

Further, in the above described second to twelfth, fourteenth, and fifteenth exemplary embodiments, the light emitting element (VCSEL 3, 8) is used. However, it is also possible to use a vertical cavity surface emitting diode or a light receiving element, in the same manner as in the first exemplary embodiment.

Still further, in the above described second to twelfth, fourteenth, and fifteenth exemplary embodiments, an example wherein the optical waveguide 7 and the VCSEL 8 are in a form of multi-bit is shown. However, a combination of the light emitting element and the light receiving element both having 2-bits, for example, may be also employed.

The optical transmission apparatus and the optical transmission system in the above described exemplary embodiments may be applied to electronic appliances such as a portable cellular phone, personal computer, electronic dictionary, and so on.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various exemplary embodiments and with the various modifications as are suited to the particular use contemplated. It is intended that the scope of the invention be defined by the following claims and their equivalents.

What is claimed is:

1. An optical transmission apparatus comprising:
   an optical element that has at least one of a light emitting part and a light receiving part on a surface opposed to a mounting surface of the optical element;
   an optical waveguide that is made of a polymer material, and has an optical path deflecting part in a through hole or an opening, wherein the optical path deflecting part deflects a one-way optical path of the optical waveguide with respect to the at least one of the light emitting part and the light receiving part of the optical element; and
   a substrate that has a first side wall, a second side wall, a mounting region on which the mounting surface of the optical element is mounted, and a plurality of waveguide holding parts formed integrally with the substrate, each waveguide holding part holding the optical waveguide so that the optical path deflecting part of the optical waveguide is arranged opposite to the at least one of the light emitting part and the light receiving part of the optical element;
   the optical waveguide being formed so that a width of the optical waveguide in a direction orthogonal to the optical path of the optical waveguide extends to the first side wall and the second side wall;
   the plurality of the waveguide holding parts being arranged along the optical path inside the optical waveguide so as to pass across the optical path deflecting part, a part of the optical waveguide which is not used for an optical transmission being extended from the optical path deflecting part, and a distal end portion of the part of the optical waveguide being held by one of the plurality of the waveguide holding parts.

2. The optical transmission apparatus according to claim 1, wherein the optical element has a plurality of light emitting parts and light receiving parts for a plurality of optical transmissions, and the optical waveguide has a plurality of cores corresponding to a total number of the plurality of the light emitting parts and the light receiving parts.

3. The optical transmission apparatus according to claim 1, further comprising:
   a cover that is arranged on the optical waveguide and that covers the through hole.

4. The optical transmission apparatus according to claim 1, wherein the optical waveguide covers the mounting region to prevent a dust from entering in the mounting surface of the optical element.

5. The optical transmission apparatus according to claim 4, wherein the optical waveguide has a window which opens in a wiring region of a bonding wire connected to at least one of the optical element and an electronic component which are mounted on the mounting region.

6. The optical transmission apparatus according to claim 5, wherein the optical waveguide has a cover which covers the window.

7. The optical transmission apparatus according to claim 1, wherein the optical path deflecting part has an inclined surface at an optical transmission side of the through hole or the opening, and the inclined surface is a mirror surface.

8. The optical transmission apparatus according to claim 1, wherein the through hole of the optical path deflecting part is filled with resin.

* * * * *